US012755932B2

(12) United States Patent
Klimczak et al.

(10) Patent No.: US 12,755,932 B2
(45) Date of Patent: Oct. 6, 2026

(54) HIGH POWER GENERATOR AND METHOD OF SUPPLYING HIGH POWER PULSES

(71) Applicant: TRUMPF Huettinger Sp. Z O. O., Zielonka (PL)

(72) Inventors: Andrzej Klimczak, Warsaw (PL); Andrzej Gieraltowski, Warsaw (PL); Michal Balcerak, Marki (PL)

(73) Assignee: TRUMPF HUETTINGER SP. Z O. O., Zielonka (PL)

( * ) Notice: Subject to any disclaimer, the term of this patent is extended or adjusted under 35 U.S.C. 154(b) by 44 days.

(21) Appl. No.: 18/814,667

(22) Filed: Aug. 26, 2024

(65) Prior Publication Data

US 2024/0429024 A1 Dec. 26, 2024

Related U.S. Application Data

(63) Continuation of application No. PCT/EP2023/054986, filed on Feb. 28, 2023.

(30) Foreign Application Priority Data

Feb. 28, 2022 (EP) .................................... 22461517

(51) Int. Cl.
*H01J 37/32* (2006.01)

(52) U.S. Cl.
CPC .. *H01J 37/32146* (2013.01); *H01J 37/32174* (2013.01); *H01J 37/32935* (2013.01); *H01J 2237/002* (2013.01)

(58) Field of Classification Search
CPC ........... H01J 37/32146; H01J 37/32174; H01J 37/32935; H01J 2237/002
See application file for complete search history.

(56) References Cited

U.S. PATENT DOCUMENTS 546,129 A 9/1895 Bauer
4,575,668 A 3/1986 Baker
(Continued)

FOREIGN PATENT DOCUMENTS

AU 2009263071 A1 * 12/2009 .............. H02M 7/48
CN 105024585 A 11/2015
(Continued)

OTHER PUBLICATIONS

ICT Power Company, Fiber Optically Coupled IGBT Driver Modules, Jan. 2008, pp. 1-5, NTAN06-DRP Rev 2, ICT Power Company, Corporate Drive Burlington L7L 5R6, Canada, XP055945048.
(Continued)

*Primary Examiner* — Adam D Houston
(74) *Attorney, Agent, or Firm* — LEYDIG, VOIT & MAYER, LTD.

(57) ABSTRACT

A high power (HP) generator includes a plurality of low power (LP) generators, a coupling in which the plurality of LP generators is electrically connected, and a control unit. During operation, at least in some states of the HP generator, a coupling-value at an output of the coupling is higher than an LP-generator-value at an output of one of the plurality of LP generators. The control unit is configured to select a respective contribution of each of the plurality of LP generators in order to generate a rise and/or a decay of a pulse at the output of the coupling, in a sequenced way through the plurality of LP generators. The control unit is further configured to select the respective contribution of each of the plurality of LP generators in a galvanically isolated way, via a fiber optic connection or a magnetically coupling.

15 Claims, 19 Drawing Sheets

(56) References Cited

U.S. PATENT DOCUMENTS 5,365,421 A * 11/1994 Eastman .......... H02M 3/33569 363/20
5,717,293 A 2/1998 Sellers
5,905,646 A * 5/1999 Crewson .......... H03K 3/57 363/16
6,046,918 A 4/2000 Jitaru
6,066,901 A * 5/2000 Burkhart .......... H03K 3/57 307/106
6,469,486 B1 10/2002 Jitaru
7,301,250 B2 * 11/2007 Cassel .......... H03K 3/57 307/106
7,550,876 B2 * 6/2009 Cassel .......... H03K 3/57 307/108
9,287,086 B2 3/2016 Brouk et al.
10,264,663 B1 4/2019 Long et al.
10,474,184 B2 11/2019 Kim et al.
10,607,813 B2 3/2020 Fairbairn et al.
11,232,931 B2 1/2022 Huh et al.
11,830,704 B2 11/2023 Koshimizu et al.
2003/0099122 A1 * 5/2003 Cho .......... H02M 3/33571 363/125
2005/0017751 A1 * 1/2005 Gunn .......... G01R 15/142 324/764.01
2005/0145611 A1 * 7/2005 Blankenship .......... H05H 1/36 219/130.1
2005/0248216 A1 * 11/2005 Cassel .......... H03K 3/57 307/106
2006/0279974 A1 12/2006 Hanington et al.
2007/0139090 A1 * 6/2007 Cassel .......... H02M 11/00 327/181
2007/0205727 A1 9/2007 Tamita et al.
2009/0213625 A1 8/2009 Adler
2009/0316438 A1 * 12/2009 Crewson .......... H03K 17/127 363/16
2010/0165668 A1 * 7/2010 Lin .......... H02M 3/28 363/21.02
2010/0276273 A1 11/2010 Heckman et al.
2014/0061030 A1 3/2014 Krassnitzer et al.
2014/0145614 A1 * 5/2014 Alexandrov .......... H05B 41/2806 315/85
2018/0323576 A1 * 11/2018 Crawford .......... H02M 1/088
2020/0035457 A1 1/2020 Ziemba et al.
2020/0118794 A1 4/2020 Koshimizu et al.
2020/0168437 A1 5/2020 Ziemba et al.
2020/0234921 A1 * 7/2020 Dorf .......... H01J 37/32082
2021/0151295 A1 5/2021 Ziemba et al.
2021/0218390 A1 7/2021 Kuznetsov
2021/0244276 A1 8/2021 Nankivil et al.
2021/0296093 A1 9/2021 Koshimizu
2022/0415615 A1 12/2022 Cubaynes et al.
2023/0188123 A1 6/2023 Tsuda et al.
2023/0411128 A1 * 12/2023 Nagami .......... H01J 37/32724
2024/0048056 A1 * 2/2024 Miller .......... H02M 3/33523
2024/0055225 A1 * 2/2024 Brouk .......... C23C 14/345
2024/0083856 A1 3/2024 Hunt et al.
2024/0379328 A1 * 11/2024 Ziemba .......... H01J 37/32082
2025/0239435 A1 * 7/2025 Azad .......... H01J 37/32183
2025/0308847 A1 * 10/2025 Guo .......... H01J 37/32146

FOREIGN PATENT DOCUMENTS

CN 109474259 A * 3/2019 .......... H02J 7/865
CN 219279912 U * 6/2023
CN 118199420 A * 6/2024 .......... G06F 30/30
DE 102011018363 A1 10/2012
EP 1725083 A1 11/2006
JP H0341827 A 2/1991
JP H09047032 A 2/1997
JP H11341827 A 12/1999
JP 2012525712 A 10/2012
JP 2016051542 A 4/2016
JP 2020061546 A 4/2020
JP 2021150056 A 9/2021
JP 2023504709 A 2/2023
JP 2023524780 A 6/2023
KR 20160038507 A * 4/2016 .......... H01J 23/24
TW 201929613 A 7/2019
TW 202135123 A 9/2021
WO 2005094138 A1 10/2005
WO WO 2016064725 A1 4/2016
WO WO 2019220868 A1 11/2019
WO WO-2021255875 A1 * 12/2021 .......... H03K 3/57

OTHER PUBLICATIONS

Pooya Davari et al., A Flexible Solid-State Pulsed Power Topology, IEEE, 15th International Power Electronics and Motion Control Conference, EPE-PEMC Dec. 2012 ECCE Europe, Novi Sad, Serbia.

L. M. Redondo et al., All Silicon Marx-bank Topology for High-voltage, High-frequency Rectangular Pulses, Conference Paper in PESC Record—IEEE Annual Power Electronics Specialists Conference, Jul. 2005, DOI: 10.1109/PESC.2005.1581777.

U.S. Appl. No. 18/814,669, filed Aug. 26, 2024.
U.S. Appl. No. 18/815,860, filed Aug. 27, 2024.
U.S. Appl. No. 18/815,903, filed Aug. 27, 2024.
U.S. Appl. No. 18/814,717, filed Aug. 26, 2024.
U.S. Appl. No. 18/817,255, filed Aug. 28, 2024.
U.S. Appl. No. 18/817,265, filed Aug. 28, 2024.
U.S. Appl. No. 18/817,264, filed Aug. 28, 2024.
U.S. Appl. No. 18/814,661, filed Aug. 26, 2024.
U.S. Appl. No. 18/817,252, filed Aug. 28, 2024.

* cited by examiner

HIGH POWER GENERATOR AND METHOD OF SUPPLYING HIGH POWER PULSES

CROSS REFERENCE TO RELATED APPLICATIONS

This application is a continuation of International Application No. PCT/EP2023/054986 (WO 2023/161518 A1), filed on Feb. 28, 2023, and claims benefit to European Patent Application No. EP 22461517.9, filed on Feb. 28, 2022. The aforementioned applications are hereby incorporated by reference herein.

FIELD

Embodiments of the present invention relate to a high power (HP) generator configured to deliver pulsed high power with a high voltage value and/or high current value to a capacitive load, in particular to a plasma process. Embodiments of the present invention also relate to a method of supplying a plasma process with high power pulses.

BACKGROUND

Some plasma treatment applications, such as etching or layer deposition, demand a high voltage (HV), high frequency (HF), rectangular, asymmetrical, pulsed voltage supply. Often the voltage values significantly exceed the voltage handling possibilities of individual semiconductor switches, especially when high frequency operation is required.

SUMMARY

Embodiments of the present invention provide a high power (HP) generator configured to deliver a pulsed high power with a high voltage value and/or a high current value to a capacitive load. The HP generator includes a plurality of low power (LP) generators. Each respective LP generator includes a respective energy storage component. During operation, the respective energy storage component is charged to a respective predefined value related to the respective energy storage component. Each respective LP generator is configured to supply, during operation, at an output thereof a respective LP-generator-value, which corresponds to the respective predefined value of the respective energy storage component incorporated in the respective LP generator. The HP generator further includes a coupling, in which the plurality of LP generators is electrically connected such that a coupling-value at an output of the coupling, which corresponds to an output value at an output of the HP generator is obtainable. During operation, at least in some states of the HP generator, the coupling-value is higher than the LP-generator-value at the output of one of the plurality of LP generators. The HP generator further includes a control unit configured to select a respective contribution of each of the plurality of LP generators to the output value of the HP generator during power delivery of the HP generator, in order to generate a rise and/or a decay of a pulse at the output of the coupling. The control unit is further configured to select the respective contribution of each of the plurality of LP generators in a galvanically isolated way, via a fiber optic connection or a magnetically coupling.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Figure 1:
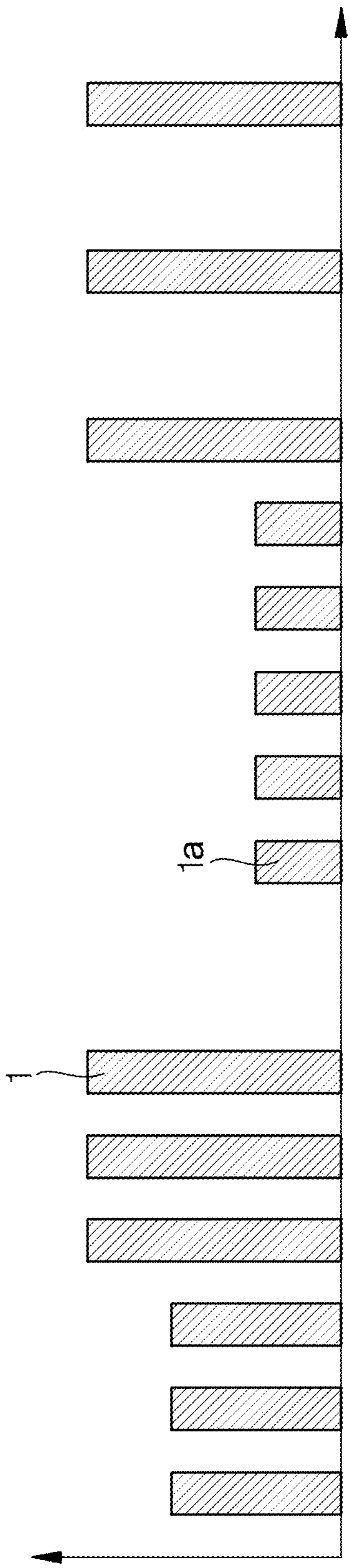
FIG. 1 shows a sequence of pulses with varying amplitude according to some embodiments.

Embodiments of the present invention provide a high-power generator and a method of supplying a plasma with high power pulses that allow supply of a plasma process with quickly varying power (pulses).

According to a first aspect, embodiments of the invention relate to a high power (HP) generator configured to deliver high power with a high value of voltage and/or a high current value to a capacitive load, in particular to a plasma process. By a capacitive load is meant a load with a capacitive part, which means, that a voltage rise on this load implies a high current capability. The capacitive part may in these cases at least be 100 pF, preferred 200 pF or more, such as around 500 pF. This could be a load in a plasma process as, for example, a plasma treatment application. According to some embodiments, the HP generator comprising:

several low power (LP) generators, each LP generator comprising an energy storage component, wherein in use the energy storage component is charged to a predefined value related to the energy storage component, each LP generator supplying, in use, at its output an LP-generator-value which corresponds to the value of the energy storage component incorporated in the respective LP generator, a coupling, in which the LP generators are electrically connected such that a coupling-value at the output of the coupling, which corresponds to the output value of the HP generator, may be obtained, which is, in use, at least in some states of the HP generator higher than the LP-generator-value at the output of one of the LP generators, a control unit configured to select the contribution of LP generators to the output value of the HP generator during power delivery of the HP generator in order to generate a rise and/or decay of a pulse at the output of the coupling.

In one aspect the control unit is configured to select the contribution of LP generators in a galvanically isolated way, in particular via a fiber optic connection or magnetically coupling. Some or preferred each of the LP generators may be selected by the control unit by control of switching units. The connection between output of a data processor and the switching units may be realized by fiber optics or by magnetically coupling. This could help to switch all LP generators effectively and fast and without time delay to form a pulse with sharp edges in voltage, e.g. Several switching elements of one switching unit could be connected by one galvanically isolated connection. Several LP generators with corresponding switching units could be merged to one group, which could be configured in a way that this group is activated or deactivated only together. Then, for such a group it is possible to use only one galvanically isolated connection. Reducing the number of galvanically isolated connections could save costs and makes the HP generator more reliable due to less parts with failure risk. Advantageously each switch has its own galvanically isolated connection. Several transmitters may, however, be controlled by one control signal if merged. This reduces the number of I/O ports needed.

According to one aspect the output of the coupling and/or the output of the HP generator (10), in use, is a step-function, in particular a real step-function without a continuous slope.

According to one aspect the LP generators are activated sequentially during one pulse. This means that not all LP generators are activated at once with the beginning of the pulse. So, for example, if a pulse has a length of 0.5 μs to 2 μs, then a first LP generator or a stack of some of the LP generators are activated at the beginning of the pulse. Some 10 ns or 100 ns later, one or some additional LP generators are activated, so that the pulse at the output of the HP generator rises. And then, some more 10 ns or 100 ns later the next LP generator or stack of LP generators are activated additionally, so that the pulse further rises. For a decay of the pulse one or some of the LP generators could be deactivated stepwise in the same way. By 'activating one or some LP generator(s)' is meant that the control unit selects these LP generator(s) to bring a contribution to the output value of the HP generator during power delivery of the HP generator. In other words, the control unit may be configured to select the contribution of each LP generator to the output value of the HP generator several times during a pulse at the output of the HP generator.

According to one aspect the coupling comprises more than four electrically connected LP generators, in particular 6 or more LP generators, preferably 10 or more, most preferred 15 or more LP generators. With such a high amount of LP generators it is possible to generate a real step-function without a continuous slope.

In one aspect the control unit is configured to select the contribution of the LP generators in a way that at least one amplitude step is lower than 500 V and/or in a way that no generator with a continuous slope output is needed.

With such solutions no continuous slope generating generator is needed, which makes the HP generator more efficient.

In one aspect the coupling and the control unit are configured to connect the LP generators by switching only.

In one aspect the control unit may be configured to select the contribution of the LP generators to the output value of the HP generator to form a step-line pulse shape at the rising and/or falling edge of a pulse.

In one aspect the number of LP generators is high enough to form at the output of the coupling pulses with a voltage rise and/or fall with values equal or higher as a sum of several values of the LP generators, and a step-line pulse shape, where the value of a step corresponds to a value equal or higher as the value(s) of one or more of the LP generators.

According to one aspect the charging energy of the LP generators is supplied over a transformer, with a primary winding, and a secondary winding for each LP generator, the secondary winding connected to a rectifier, each rectifier connected to the energy storage component of the corresponding LP generator. The rectifier may comprise at least one semiconductor element such as a diode. The rectifier may comprise four diodes connected in a bridge rectifier way. The rectifiers and/or the transformer(s) may be part of power source.

Several, in particular each LP generators may have its corresponding transformer.

Several, in particular each of the transformers corresponding to an LP generator, may have its own magnetic core.

Several, in particular each transformer corresponding to an LP generator, may comprise a balancing winding, preferred two balancing windings.

This allows an AC supply current to flow freely along the transformers, supplying charge to the loaded stages, i.e. LP generators connected to the load, and preventing the unloaded stages, i.e. the LP generators not connected to the load and thus not contributing to the HP generator output, from being over-charged. The same concept may be used to power the driver circuits.

One balancing winding of one transformer may be connected to a balancing winding of a different transformer.

So, several, in particular each transformer corresponding to an LP generator, may be connected in an open chain configuration.

The primary winding of several, in particular each primary winding of a transformer corresponding to an LP generator, may be connected in series. This could mean one wire is leaded through all transformers in series, configured to be supplied by an AC supply current.

The high voltages and currents may be separated in an efficient and effective way, if each transformer has its own magnetic core and the only common elements are the primary windings, which can be made by one common wire.

Several, in particular each transformer corresponding to an LP generator, also called 'stage', may be embodied as ring-core transformers.

In one aspect a balancing circuit comprising a component allowing current flow in one direction only, in particular a diode or component working like a diode, is connected between two LP generators. E.g., a negative output of several, in particular each LP generator's energy storage component, in particular as capacitor, is connected with the same potential of preceding LP generator with such a balancing circuit. This may enable the charge from a lower LP generator energy storage component to be transferred to the energy storage component on a higher LP generator when the switch which is in parallel to the load is activated and if the lower LP generator energy storage component value exceeds that on the higher LP generator. 'Activated' shall mean: 'switched to an on-state', or 'switched to a low impedance at its output'. With the 'switch parallel to the load' is meant the switching element which is responsible to disconnect the corresponding LP generator from the nearby connected LP generator when activated. In FIG. 2*a*, 2*b*, 4, 5 these are the switching elements S1. In FIG. 3 these are the switching elements S2. With the connecting switch is meant the switching element which is responsible to connect the corresponding LP generator when activated. In FIG. 2*a*, 2*b*, 4, 5 these are the switching elements S2. In FIG. 3 these are the switching elements S1. The energy storage component of the highest LP generator will accumulate the excessive charge from the entire stack. These highest LP generators may therefore advantageously be controlled in a way to provide more power to the load than the other LP generators in order to get rid of the excessive charge.

In one aspect a damping circuit may be positioned between several, in particular all of the LP generators in an open chain configuration. Open chain configuration shall mean that such a damping circuit is positioned between every LP generator and its next higher LP generator, but not between the highest and lowest. The damping circuit may comprise a resistor and/or an inductivity if the energy storage component is a capacitor. The damping circuit may comprise a resistor and/or a capacitor if the energy storage component is an Inductor. The damping circuit between the LP generators may be positioned preferably in series with the balancing circuit. The damping circuit may be used to eliminate oscillations on the parasitic components of the charge handling path.

The entire HP generator may be directly liquid cooled. This may be done by immersed dielectric cooling liquid, in particular the LP generators are bathed by dielectric cooling liquid. All components of the HP generator, including the transformers, may be immersed dielectric cooling liquid which reduces clearance and creepage requirements, while delivering high cooling ability. This allows improved usage of a safe operating area of all components and results in further size reduction and decreased parasitic inductance and capacitance. This leads to a small size of the entire HP generator and increased efficiency.

Several, in particular all, LP generators and the control unit at least partially, at least with the switching units may be located in one housing. The coupling may be located in the same housing. The transformer and the rectifier may be located in the housing. The housing may be liquid-proof. The dielectric cooling liquid may flow through the housing. By that the cooling and isolation could be enhanced. Distances could be reduced. This allows to use shorter wire lengths which reduces the inherent inductances which makes the switching capabilities faster. The temperature differences between different switches and other components of the LP generators and/or coupling may be decreased by this kind of direct liquid cooling. So, an advanced balancing is possible.

In one aspect the control unit may be configured to select the contribution of the LP generator in a sequenced way through the LP generators. In particular each pulse sequence may begin on a different LP generator, so that all n LP generators are equally loaded after n pulses. This leads to an enhanced load distribution among the LP generator stack and thus better power-loss balance between the switching elements.

In one aspect the control unit may comprise switching units, having current rise capability of at least 10 A/μs. With such high current rise capability, it is possible to charge the capacitive load fast enough.

In one aspect the control unit may comprise switching units, having capability of withstanding voltage of about 0.5 kV or more with voltage rise and fall rates of 15 kV/μs or more. By that, an extremely pulse with extremely sharp voltage transitions may be realizable. This is an extremely needed feature for many applications such as plasma processes, especially in semiconductor plasma processes.

In one aspect the control unit may be configured to select the contribution of LP generators in a way to reduce voltage overshoots at the output of the HP generator and/or at a dedicated location on the load, in particular at the substrate of a plasma process. This may be done by a first step at the output of the HP generator which is only a part, in particular the half, of the value of the second step which may be the full amount, e.g., In one aspect at least one, preferably several, most preferred all LP generators comprise an LP-generator-value limiting circuit, such as a voltage limiting circuit or a current limiting circuit. This might be an additional switching element with an additional resistor or a variable eclectically controllable impedance with a power dissipating part. With such a circuit, the HP generator could be made much more reliable.

In one aspect the voltages on all LP generators, also called 'stages', are equal despite their unbalanced loads. Also, the primary-to-secondary winding isolation (ground-to-HV) is easy to obtain by positioning the primary path near the middle of the ring-core transformers, while keeping the secondary winding close to the core and away from the primary winding. The balancing windings can be placed close to the secondary winding, because only the stage-to-stage voltage insulation should be provided here.

The meaning of 'the control unit is configured to select the contribution of LP generators to the output value of the HP generator' shall be understood as the ability and configuration of the circuit of the HP generator in combination with the program of the control unit, that enables the HP generator to select a choice of LP generators with their respective LP-generator-value to supply a contribution to the output value of the HP generator.

The control unit may comprise a data processor, embodied for example as an embedded microcontroller with a program memory, embodied as a non-volatile data memory, e.g., and a data memory, embodied as a volatile data memory, e.g. Such a control unit typically comprises data interfaces for incoming data, such as measurement data, control input data and so on, as well as outcoming data, as control signals, information signals, alert signals, and so on. Such a control unit typically comprises data computing section, data comparing possibilities and similar circuits enabling it to compute new data out of incoming data, find decisions related to incoming and/or computed data, and output relevant data signals to control other electrical circuits of the HP generator, e.g.

The output of the coupling could be the output of the HP generator. But it is also possible that some minor additional voltage or current shaping components may be connected between the output of the coupling and the output of the HP generator. This minor additional voltage or current shaping components could be filters or small voltage, current, or power sources with much smaller amount than the output value of the coupling.

With 'states of the HP generator' is meant the different states the HP generator could be, when being in use, depending on the activation of the different LP generators and/or switching units and/or switching elements in the HP generator.

High power means 10 kW during pulsing or more. High value of voltage means 4 kV or more. High current means 10 A or more. The HP generator may be configured to influence a voltage and/or movement of charge carriers in a plasma and/or between a plasma potential and a substrate in a plasma process. An energy storage component may be a capacitor or an inductor and/or other energy storage component. It should be understood as an energy storage component being configured to store an amount of energy, which could be a reasonable part of the output energy of one pulse of the HP generator, which means at least 1/200, preferably at least 1/100, even more preferred at least 1/50 of the energy of one pulse of the HP generator. Continuously charging the energy storage component includes charging to a predefined value of voltage of a capacitor or a predefined value of current of an inductor. The electrical connection of the LP generators in the coupling may be a series connection, a parallel connection or a combination of both. The coupling value may be a voltage, a current or a power. The control unit may determine which of the LP generators contributes to the output power of the HP generator. The control unit may be configured to control the LP generators such that at least two LP generators contribute to the output of the HP generator, i.e., that the output values of at least two LP generators are added to form an HP output value.

The main advantage is that the energy storage components are charged independently of the state of the control unit. That means that there is no limitation in duty cycle of the generated output value, in particular output pulses, their widths and in consequence: the mean output power. The second advantage is that each LP generator has its own energy storage component, which protects switches in the control unit against overvoltage or overcurrent, respectively. The third advantage is that all components are relatively cheap due to low power components.

The control unit may comprise switching units, wherein one switching unit is associated with each LP generator. Each switching unit may comprise one or two transistors, in particular MOSFETS. MOSFETS provide high switching capability, can be used with currents of 50 A or more, and allow voltages of 500 V or more to be switched. If MOSFETS are being used, an antiparallel diode may be provided for each MOSFET, in particular in parallel to each MOSFET. The MOSFETs may be silicon-carbide-(SiC-) based or gallium-nitride-(GaN-) based MOSFETs which are suitable for fast switching voltages of 500 V or more with high rise and fall times of voltage (15 kV/μs or more) as well as high currents (50 A or more) with high rise and fall times of current (10 A/μs or more).

Each switching unit may comprise a half-bridge circuit comprising two switching elements connected in series. One transistor may be configured to connect two of the LP generators when closed in such a way, that both values of both LP generators influence the value at the output of the coupling. In particular, the output values of both LP generators may be added. The other transistor may be configured to short-circuit the load, when activated, i.e., when the transistor is closed or in the conducting state.

Each half-bridge circuit may be clamped by its storage component, for example a capacitor. This means the storage component is directly parallel connected to its half-bridge. This configuration protects both switches from over-voltage up to the voltage of the capacitor. The storage component may also be an inductor. This configuration protects then both switches from over-current up to the current in the inductor. It is enough to maintain safe voltages/currents individual on all LP generators to prevent over-voltage or over current related failures, respectively. Thus, each LP generator maintains it's operating levels within its own. This leads to a self-maintained safe condition.

The control unit may comprise a driver. The driver may be configured to drive the switching unit, especially the transistors, in particular the MOSFETs. The control unit, in particular the switching unit, may be part of a respective LP generator.

At least 6, preferably 10 or more, preferably 15 or more LP generators may be coupled in one coupling. At least two LP generators may provide equal LP-generator-values. Preferably the majority of LP generators, or even all LP generators provide equal values. It is also possible that at least two LP generators provide different LP-generator-values, in particular, all LP generators may provide different values. One LP generator may provide an LP-generator-value that is half of the LP-generator-value of another LP generator.

A capacitor may be provided as an energy storing component in parallel to a switching unit, in particular a half bridge. This allows stabilizing the output value of the coupling. Each LP generator may have its own capacitor charged to an appropriate voltage level. Activating one switch of the associated switching unit connects the load, for example a plasma process, to the capacitor. Activating the other switch of the switching unit shortens the load. The output of the entire HP generator may present a true dynamic voltage source during each pulse enabling huge output currents and the required fast voltage transitions.

An inverter comprising a full-bridge circuit and, preferably a buck converter, may be connected to the primary windings. By that an efficient power delivery to the LP generators is possible.

In a further aspect, embodiments of the invention relate to a method of supplying a plasma process with high power pulses having varying amplitudes provided by a high power (HP) generator, comprising the steps of a. continuously charging energy storage components of multiple low power (LP-) generators to a predefined value respectively,
b. selectively coupling the output values of at least some LP generators to obtain a desired output value of the HP generator corresponding to a pulse having a desired amplitude, by controlling contribution of the LP generators to the output of the HP generator.

By using many LP generators each containing an energy storage component, together with a coupling, one can choose how many LP generators contribute to generate the output pulse. This solution is relatively safe, universal and cheap. It is safe, because every LP generator may be configured to protect its own associated switches against powers higher than the power values of their energy storage components. The solution is universal due the fact that it is possible to rapidly change the output pulse amplitude with resolution equal to the number of low power generators. It is cheap because many low power generators and low voltage switches can be used, which is usually cheaper than single HP generators and high power pulse units.

In one aspect, the LP generators, also called 'stages', may be controlled individually or in groups. Control signals may be fed to the drivers of the switching units, preferably by optic-fiber, but also other means can be used. All switches of the switching units can be controlled separately from one main control board, but also one signal can control an entire stage (e.g. the control signal for the connecting switch of the switching unit may come from the main control board; the signal for the parallel-to-the-load-switch of the switching unit may be generated on the connecting switch driver board), one signal can control a number of switches/stages in grouped control, etc. The total output value is a sum of the output values of only the activated/selected LP generators. By activating or selecting a different number of the LP generators for each pulse, one can change the total output value from pulse to pulse.

In one aspect, the output values of the LP generators, i.e. the LP-generator-values, may be dynamically stabilized. Each LP generator may have its own capacitor charged to an appropriate voltage level. Activating one switch connects the load to that capacitor. Activating the other switch shortens the load. The output of the entire HP generator presents a true dynamic power source during each pulse enabling huge output currents and the required fast voltage transitions.

Dual-step transition instead of single-step output value transition may be realized. Connecting a low impedance voltage source with a capacitive load by any connector inductance inevitably causes current and voltage oscillations. The load peak voltage reaches twice the applied voltage level. Resistive damping circuits dissipate huge amounts of power. By applying a dual step transition the power-loss can be reduced significantly. This is possible in the presented topology. Near rectangular voltage waveform shapes, lower overshoots, and significantly reduced power losses can be obtained by dual-step transition.

Several stages, also called 'LP generators' may be activated in a sequence during a lasting output pulse. Activating an LP generator means activating the corresponding connecting switching element. In order to compensate for the decaying wafer voltage, one may increase the output voltage in several steps. Each step adds its voltage to the total output voltage value. If the voltages on all stages are equal, the resolution of each step is 1/n times the voltage of the full stack of LP generators. A separate stack may be built to handle the compensation feature. This can be controlled separately and may result in much finer step resolution, resulting in more stable wafer voltage, and better ion energy distribution.

Further features and advantages of the invention result from the following detailed description of embodiments of the invention on the basis of the figures of the drawing. The features shown there are not necessarily to be understood as being to scale and are shown in such a way that the special features according to embodiments of the invention can be made clearly visible. The various features can be implemented individually or in any combination in various embodiments of the invention.

FIG. 1 shows a sequence of pulses 1 that is required by a plasma application. It can be seen that the amplitude of the pulses 1 may have to be constant for some pulses, but also may have to amplitude change from pulse 1 to pulse 1*a.*

Figure 2A:
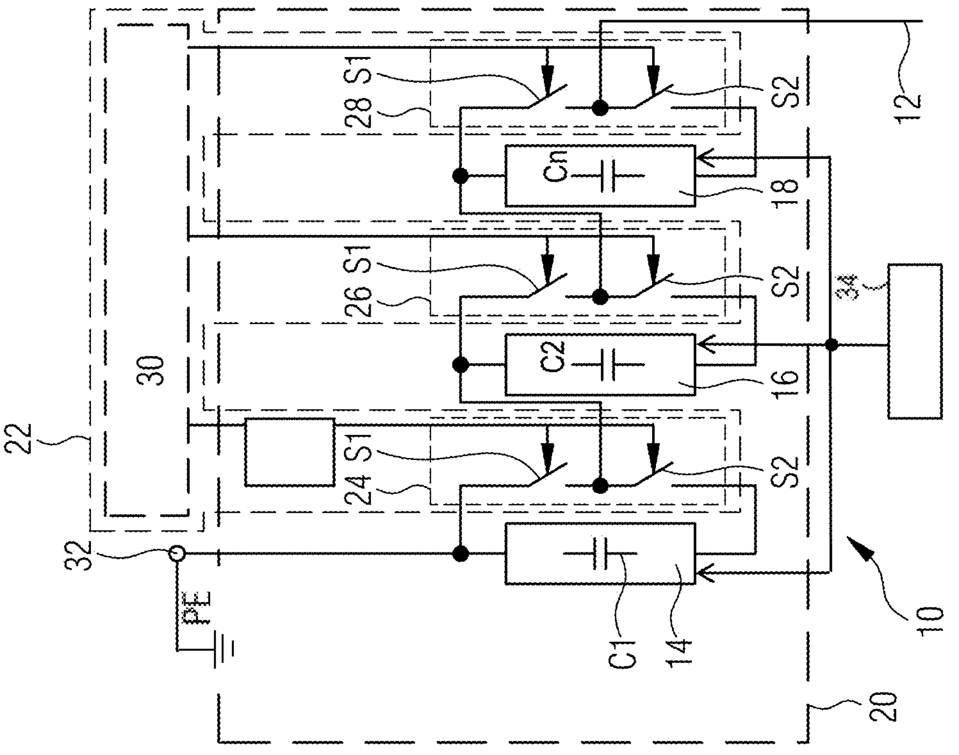
FIG. 2*a* shows a first embodiment of an HP generator.
Figure 3:
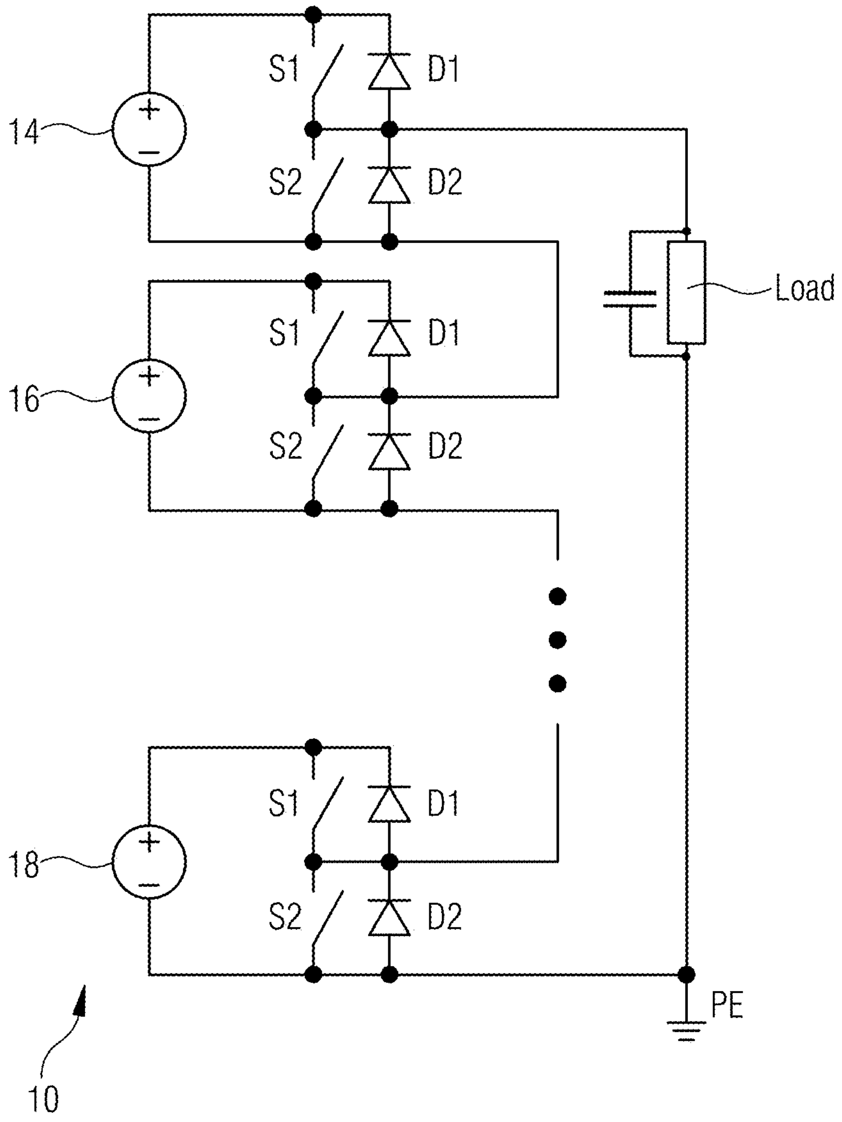
FIG. 3 shows a first embodiment of a part of an HP generator for producing positive voltage pulses.

FIG. 2*a* shows a first embodiment of a high power (HP) generator 10 suitable for producing high power pulses. The HP generator has a positive output 32 and a negative output 12. The HP generator 10 comprises several low-power-(LP-) generators 14, 16, 18, wherein each LP generator 14, 16, 18 comprises an energy storage component C1, C2, Cn in this case embodied as a capacitor. In use the energy storage components C1 are continuously charged to a predefined value related to the energy storage component C1 to keep the energy stored in it constant. In use, each LP generator 14, 16, 18 supplies at its output an LP-generator-value which corresponds to the value of the energy storage component C1 incorporated in the respective LP generator 14, 16, 18. The LP generators 14, 16, 18 are electrically connected in a coupling 20 such that a coupling-value at the output of the coupling 20, which corresponds to the output value of the HP generator 10, may be obtained, which is higher than the LP-generator-value at the output of one of the LP generators 14, 16, 18. A control unit 22 is configured to select the contribution of LP generators 14, 16, 18 to the output value of the HP generator 10 during power delivery of the HP generator 10. For clarity reasons only three LP generators are shown. Actually, much more LP generators are used, typically 6 or more, even 10 or more, especially 15 or more, in order to generate stepwise transition of the output which may be as smooth as needed for the load.

The control unit 22 comprises switching units 24, 26, 28 associated with each LP generator 14, 16, 18. The switching units 24, 26, 28 each comprise switching elements S1, S2. In the embodiment shown the switching elements S1, S2 are connected in series and thus realize a half bridge. The switching units 24, 26, 28 and thus the switching elements S1, S2 are driven by a driver 30 of the control unit 22.

The positive output 32 of HP generator is connected to ground, also called earth potential PE. All LP generators are connected to a power source 34 comprising transformers, rectifiers and an inverter connected to a grid and itself comprising a full bridge and a buck converter, which will be described in greater detail later.

Figure 2B:
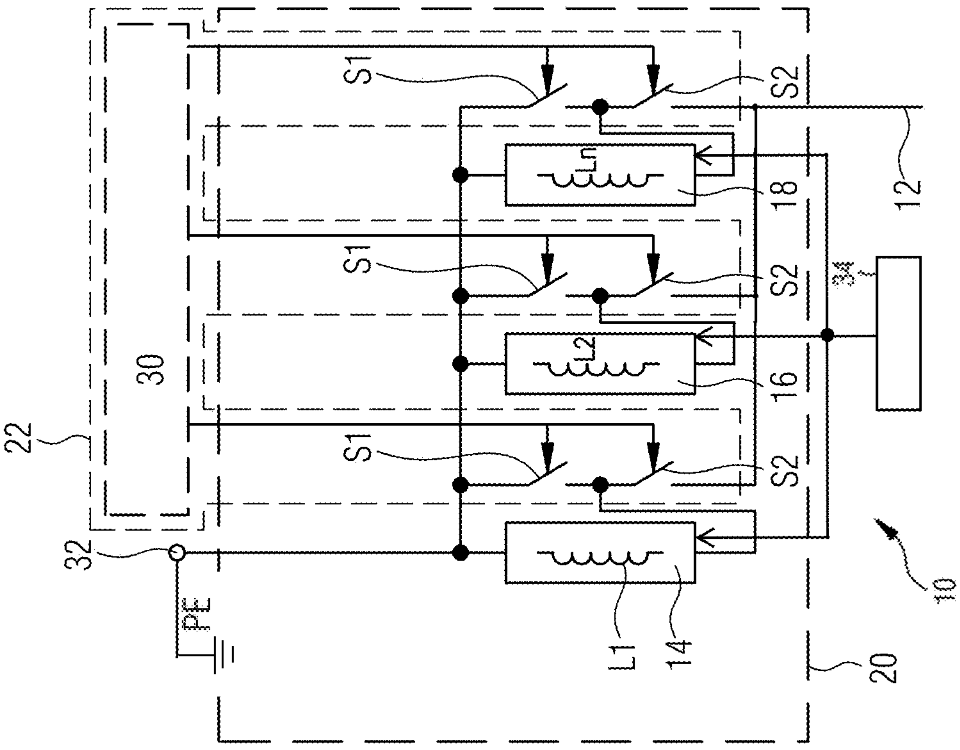
FIG. 2*b* shows a second embodiment of an HP generator.

FIG. 2*b* largely corresponds to FIG. 2*a*. Therefore, like elements carry like numerals. The difference between FIG. 2*a* and FIG. 2*b* is that in FIG. 2*b* the energy storage components are embodied as inductances L1, L2, Ln. Therefore, the electrical connection/wiring within the coupling 20 is slightly different. Generally, energy stored in an inductor turns into a current source. So, the energy storage components are parallel connected with the other current sources and leading to current multiplication.

Figure 10:
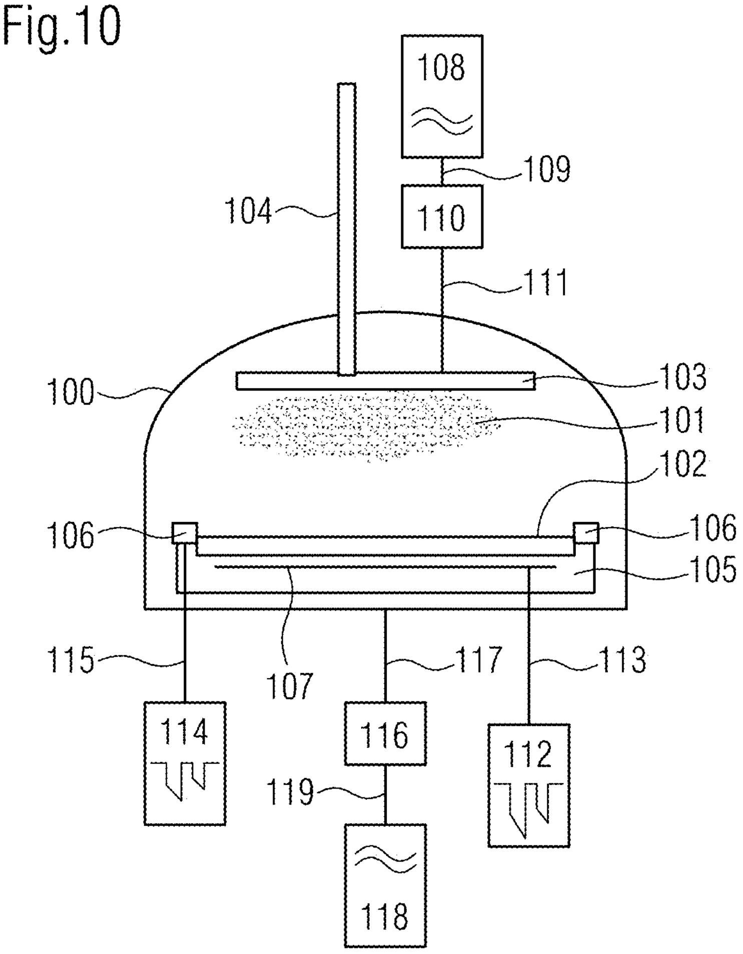
FIG. 10 shows a plasma processing system with a plasma chamber according to some embodiments.

In both Figures, FIG. 2*a*, FIG. 2*b*, the ground potential, also called earth potential PE, could be connected to one of the outputs of one of the LP generators 14, 16, 18. By that it is possible to form voltage signals with positive and negative voltage over ground as it is shown in FIG. 10 of U.S. Pat. No. 10,474,184 B2 or FIG. 21 of U.S. Pat. No. 10,607,813 B2 e.g., The ground potential could also be connected to the positive output 32 or the negative output 12. In FIGS. 2*a* and 2*b* it is connected to the positive output 32 as an example.

FIG. 3 shows a simplified embodiment of part of an HP generator 10 with several LP generators 14, 16, 18. In order to generate high-voltage pulses, it is advantageous to build a push-pull switch, which means that switching units should have at least two switching elements S1, S2: "push" (switching element S1) which is used to charge the capacitance of the plasma reactor, and "pull" (S2) which is used to discharge the capacitance of plasma reactors. In order to generate pulses with different amplitudes, while the amplitude can be changed rapidly between the pulses (like it is shown in FIG. 1, 7, 8), it is necessary to combine the outputs of two or more LP generators 14, 16, 18. LP generators 14, 16, 18 can have the same or different LP-generator-values, in this case voltage amplitudes. In FIG. 3, the ground potential, also called earth potential PE is connected to the negative output of LP generator 18.

In a situation, when none of the switching elements S1, S2 are switched on (during a transition state between two operating states) and the LP generators 14, 16, 18 are connected in series and also in series with the load (for example the plasma reactor), it is possible that switching elements S1, S2 are destroyed by the overvoltage. For that reason, it is advantageous to add diodes D1, D2 in parallel to all switching elements S1, S2 to protect them from voltages higher than the voltages stored in the respective energy storage components. This is true if the switching elements S1, S2 are embodied as MOSFETs. If the switching elements are embodied as unipolar transistors, like MOSFETs are typically, diodes are already mounted as a part of the transistors or are an integral part of the transistor die. A die, in the context of integrated circuits, is a small block of semiconducting material on which a given functional circuit is fabricated. Then these diodes could be used and there is no need to add them separately.

It is possible to generate a ground potential at the output of the HP generator (Load is short-circuited to earth potential PE). This state is achievable by switching-on switching elements S2 when earth potential is connected to the negative output 12 or positive output 32 of the HP generator. Switching elements S1 are open (switched off) during this state. In order to generate a (voltage) pulse on the load it is necessary to switch-on a suitable number of the switching elements S1. LP generators 14, 16, 18 can provide the same or different LP-generator-values, in this case voltage amplitudes. By switching on some switching elements S1 the associated LP generators are connected in series, for example LP generators 14, 16, so that the amplitude of voltage pulses on the load is equal to the sum of LP-generator-values, for example their output voltages.

Complementary switching elements S2 associated with LP generators 14, 16 should be switched off in order to avoid a short circuit in the LP generators 14, 16.

Switching elements S1 associated with LP generator 18 (or further LP generators) should be switched off and switching elements S2 can be switched on or off (the current will flow through the diodes D2 anyway).

The configuration of switching elements that are switched on and off can be changed rapidly, which leads to a rapid change of amplitude of the generated pulses at the output of the HP generator 10. The number of LP generators 14, 16, 18 which are supplying the Load can be rapidly changed to any accessible number (from 0 to n).

Figure 4:
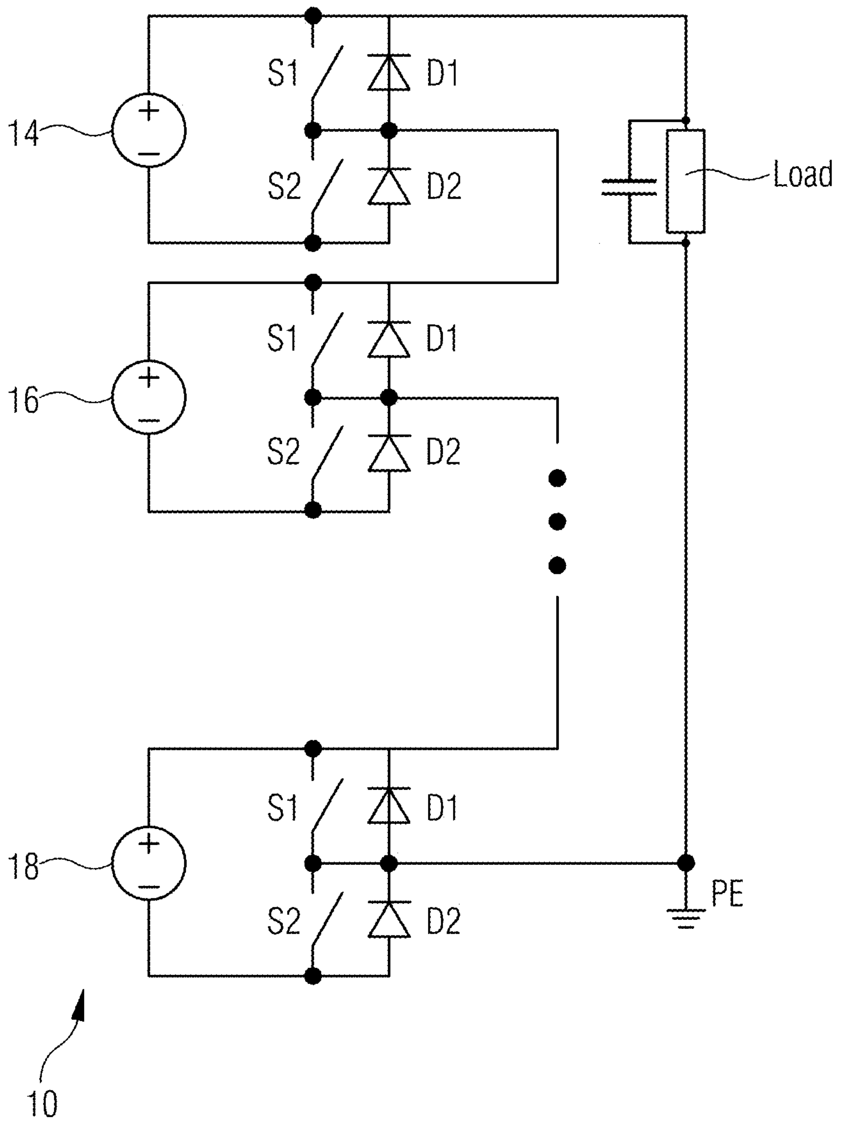
FIG. 4 shows a second embodiment of a part of an HP generator for producing positive voltage pulses.

FIG. 4 differs from FIG. 3 only in the wiring, i.e. interconnection of the LP generators 14, 16, 18 and connecting points of the Load and PE. However, the same results can be achieved as with FIG. 3, i.e. voltage pulses of different amplitude can be realized by selecting the LP generators 14, 16, 18 that contribute to the output voltage pulse by suitably driving switching elements S1, S2. In FIG. 4, the ground potential, also called earth potential PE is connected to the negative output of HP generator 10.

Figure 5:
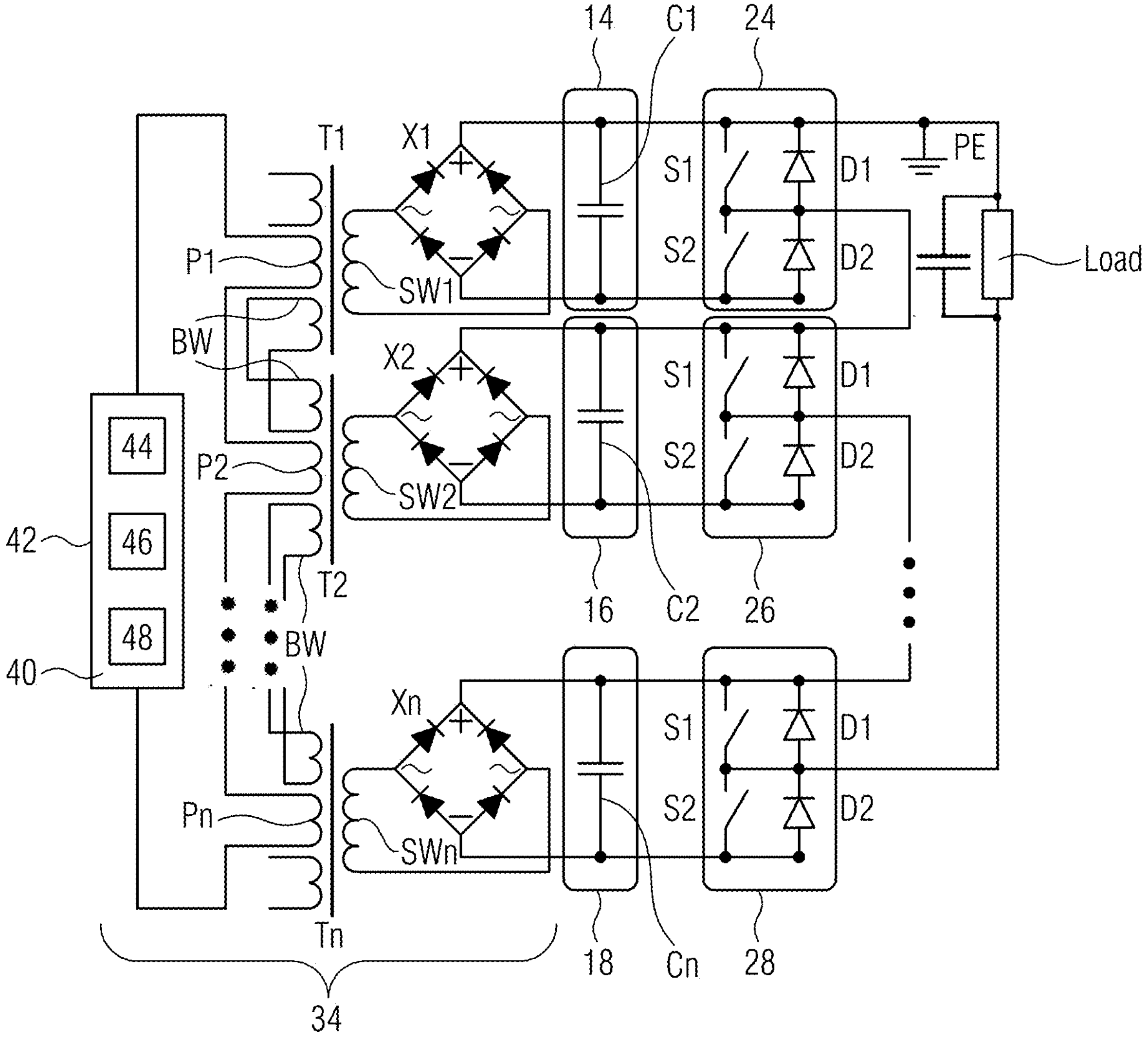
FIG. 5 shows an embodiment of an HP generator with a power supply for supplying power to the LP generators.

FIG. 5 shows in more detail the power supply of the LP generators 14, 16, 18. The energy storage components C1, C2, Cn of the LP generators 14, 16, 18 are continuously charged by transformers T1, T2, Tn respectively and associated rectifiers X1, X2, Xn respectively. It is much easier and cheaper if every transformer X1, X2, Xn has its own magnetic core and the only common elements are the primary windings P1, P2, Pn, which can be made by one common wire. In order to have the same voltages which do not depend on the load, balancing windings BW are added. The balancing windings BW equalize the magnetic fluxes in every transformer T1, T2, Tn. If the number of wires in the secondary windings SW1, SW2, SWn are the same, the voltages on the energy storage components C1 are equal. By changing the number of turns in the secondary windings SW1, SW2, SWn, one can change the charging voltages of the energy storage components C1. In that way, one can ensure that every energy storage component C1 is charged to a different voltage.

The balancing windings BW in the transformers T1, T2, Tn work in that way, that if the magnetic flux is the same in both neighboring transformers T1, T2, Tn, on both windings BW there is the same voltage, so there is no current between the windings BW. If for some reason flux in one core will be different (for example: higher) than in the next core, the induced voltages will be different in different transformers T1, T2, Tn so some current will start to flow between this windings BW. By this current the transformer T1, T2, Tn with higher flux is loaded more, while the next transformer's flux is increased by this current. Equalizing the fluxes in the magnetic cores causes the equalization of the induced voltages. The balancing windings BW should have the same number of turns in both transformers that are connected using the magnetic flux equalizing method.

The primary windings P1, P2, Pn are connected to an inverter 40, which is connected to a power grid 42. The inverter 40, which is part of a power source 34, comprises a full bridge 44 and upstream of the full bridge 44 a buck converter 46, which is connected to a rectifier 48.

Figure 6:
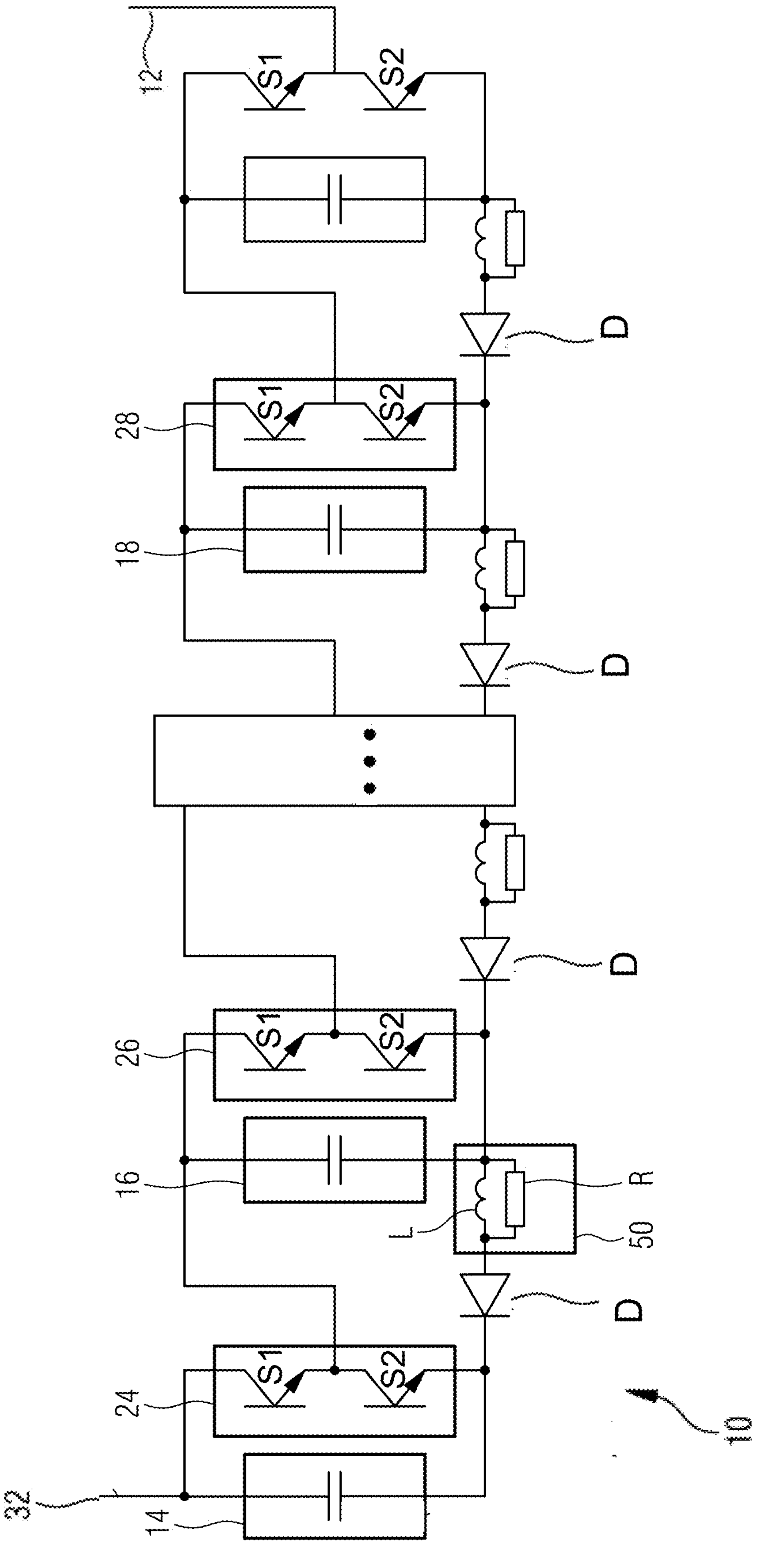
FIG. 6 shows an embodiment of an HP generator with balancing and damping circuits.

FIG. 6 shows an HP generator 10 like the one in FIG. 2*a*, e.g., where a balancing circuit comprising a component allowing current flow in one direction only, in particular a diode D or component working like a diode, is connected between two LP generators 14, 16, 18. The switching units 24, 26, 28 comprise switching elements in a half-bridge. These switching elements are shown as transistors, more precise as bipolar transistors. For high switching times a more preferred transistor type would be a MOSFET, in particular a MOSFET based on SiC or GaN. In this embodiment, where the negative terminal of each LP generator 14, 16, 18, also called stage, is connected with the same potential as the preceding LP generator 14, 16, 18 with a diode D or a circuit containing a diode. This enables the energy stored in a lower stage energy storage component to be transferred to the energy storage component on a higher stage when the switching element is activated and if the lower stage energy storage component voltage exceeds that on the higher stage. The charge of the highest stages 14 will accumulate the excessive charge from the entire stack. The highest stages 14 should therefore be controlled to provide the most power to the load in order to get rid of the excessive charge. Using diodes D or circuits containing a diode leads to better voltage distribution along the LP generator stack. A damping circuit 50, in particular in series with the balancing circuit, here the diode D, may be used to eliminate oscillations on the parasitic components of the charge handling path. The damping circuit may comprise an inductor L and/or a resistor R, in particular connected in parallel as shown in FIG. 6.

Figure 7:
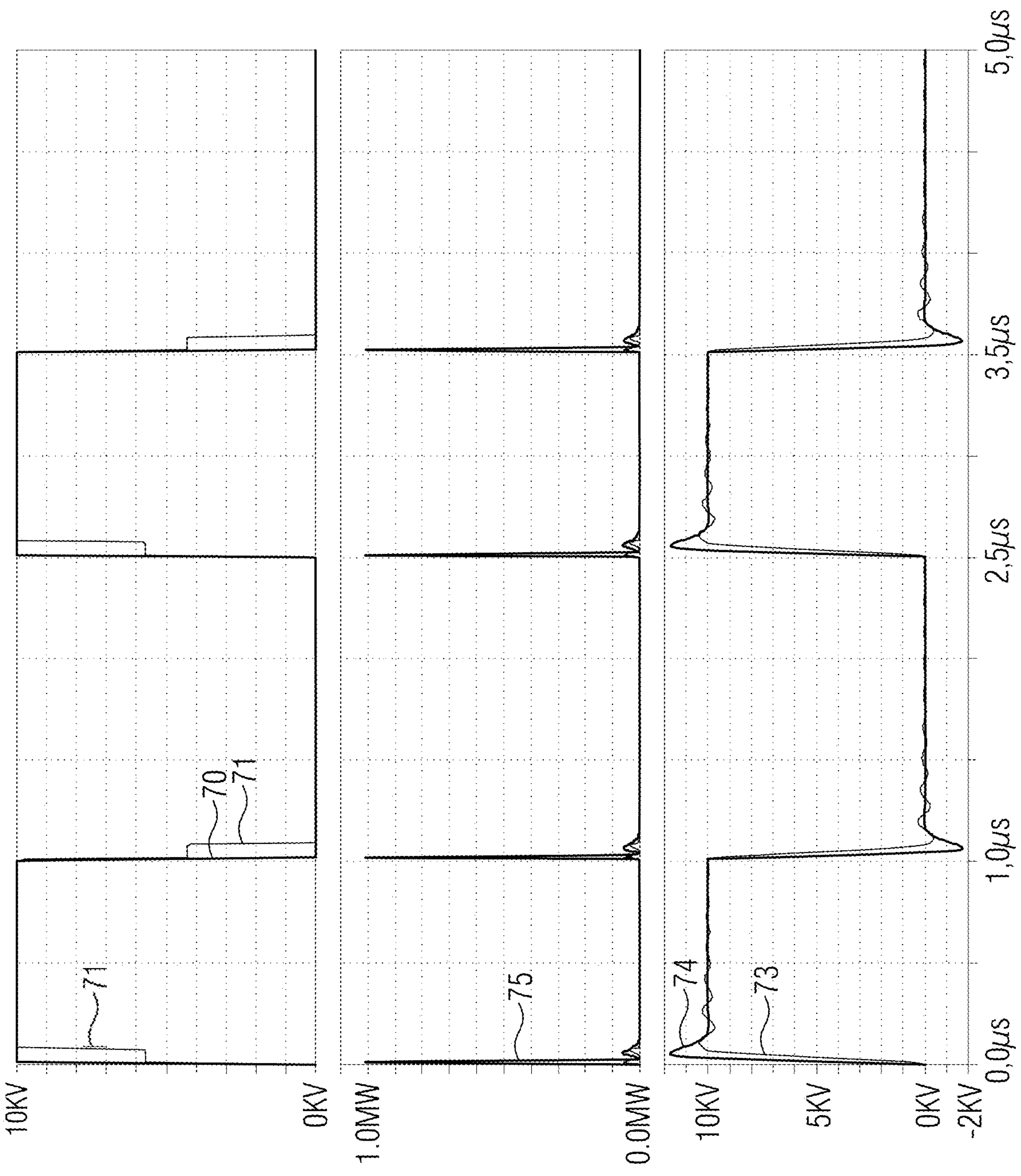
FIG. 7 shows waveform shapes and power losses in single and dual-step transition according to some embodiments.

Connecting a low impedance voltage source such like a capacitive voltage source with a capacitive load by any connector inductance inevitably causes current and voltage oscillations. Load peak voltage could reach then twice the applied voltage level. This could damage the load and is highly undesirable. Resistive snubber circuits are often used to dampen the peak voltages. Those dissipative circuits dissipate huge amounts of power and generate therefore huge amount of heat, what is also highly undesirable. By applying a dual step transition this overshoot could be controlled, reduced, or even avoided. Dissipating energy in a dissipating circuit could dramatically be reduced or even avoided. The part which should dissipate the energy may be then much smaller or could be avoided totally. Power-loss can be reduced significantly. This is possible in the presented topology and shown in FIG. 7. Waveform 70 shows single step transition 0 kV to 10 kV at the output of a coupling 20, by activating all fifteen stages, e.g., in one moment. This causes a voltage overshoot, as can be seen in FIG. 74. With a stepwise transition following a first step from 0 V to 5.5 kV, by activating only eight of fifteen stages, e.g., and a second step from 5.5 kV to 10 kV, by activating the rest of fifteen stages, e.g., some 10 or 100 ns later, as shown in waveform 71, the results are much better. The resulting waveform 73 has a much lower overshoot peak and the voltage rise is slower but fast enough for the process. As can be seen in waveform 73, dual step transition leads to a near rectangular output waveform and lower overshoots and hence almost no power dissipation, whereas single step transition leads to waveform 74 showing voltage overshoots and hence significant power loss 75. The same overshoot peak and its reduction may be seen at the falling slope after 1 μs, 3.5 μs e.g.

Figure 8:
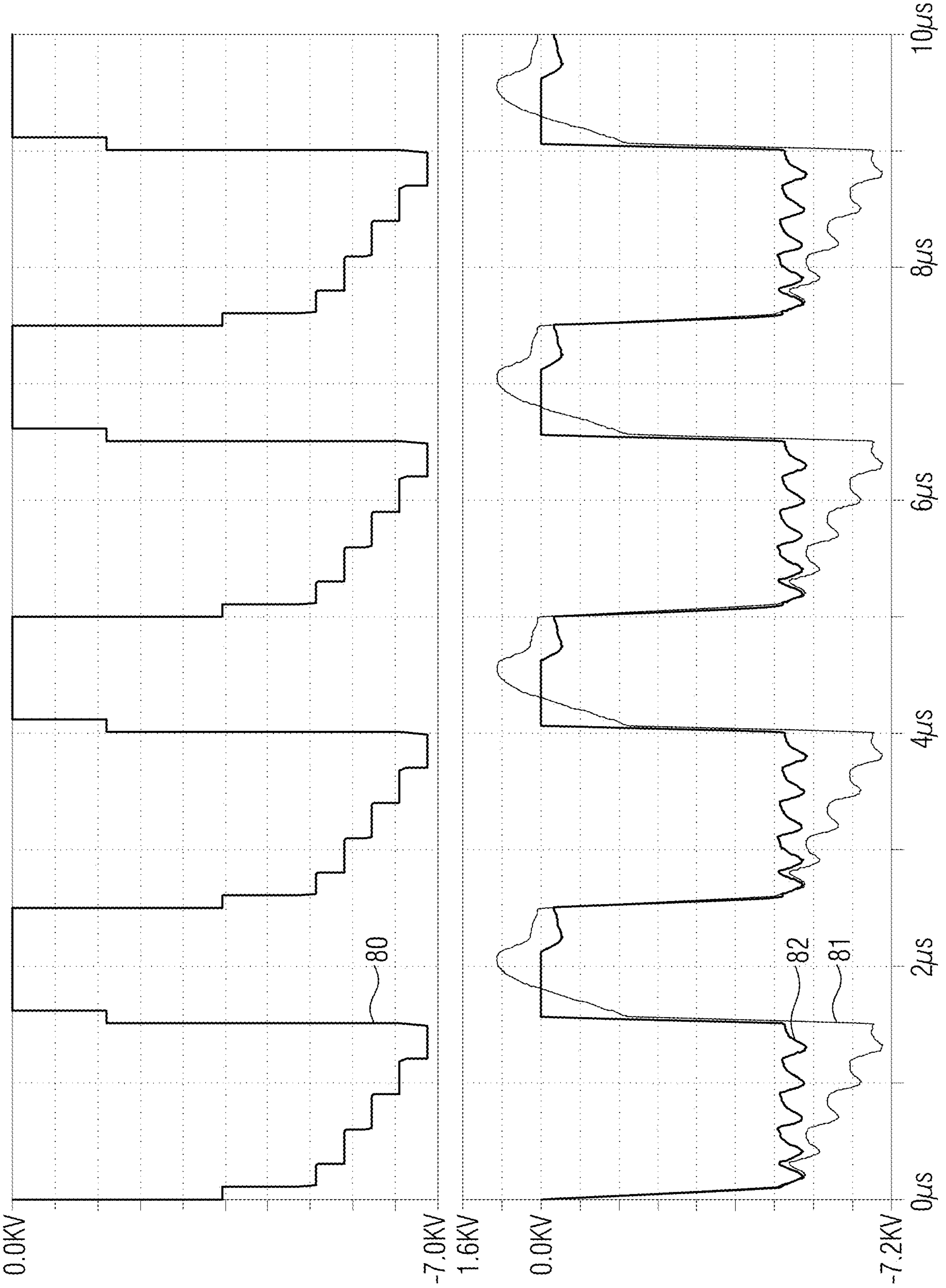
FIG. 8 shows waveforms resulting from sequential activation of LP generators according to some embodiments.

FIG. 8 shows a step-wise increase of an amplitude of a pulse 80 as a result of sequentially activating LP generators 14, 16, 18 to contribute to the HP output signal. Waveform 81 shows the voltage at the output of the HP generator and waveform 82 shows the voltage on a wafer in a plasma chamber.

Figure 9:
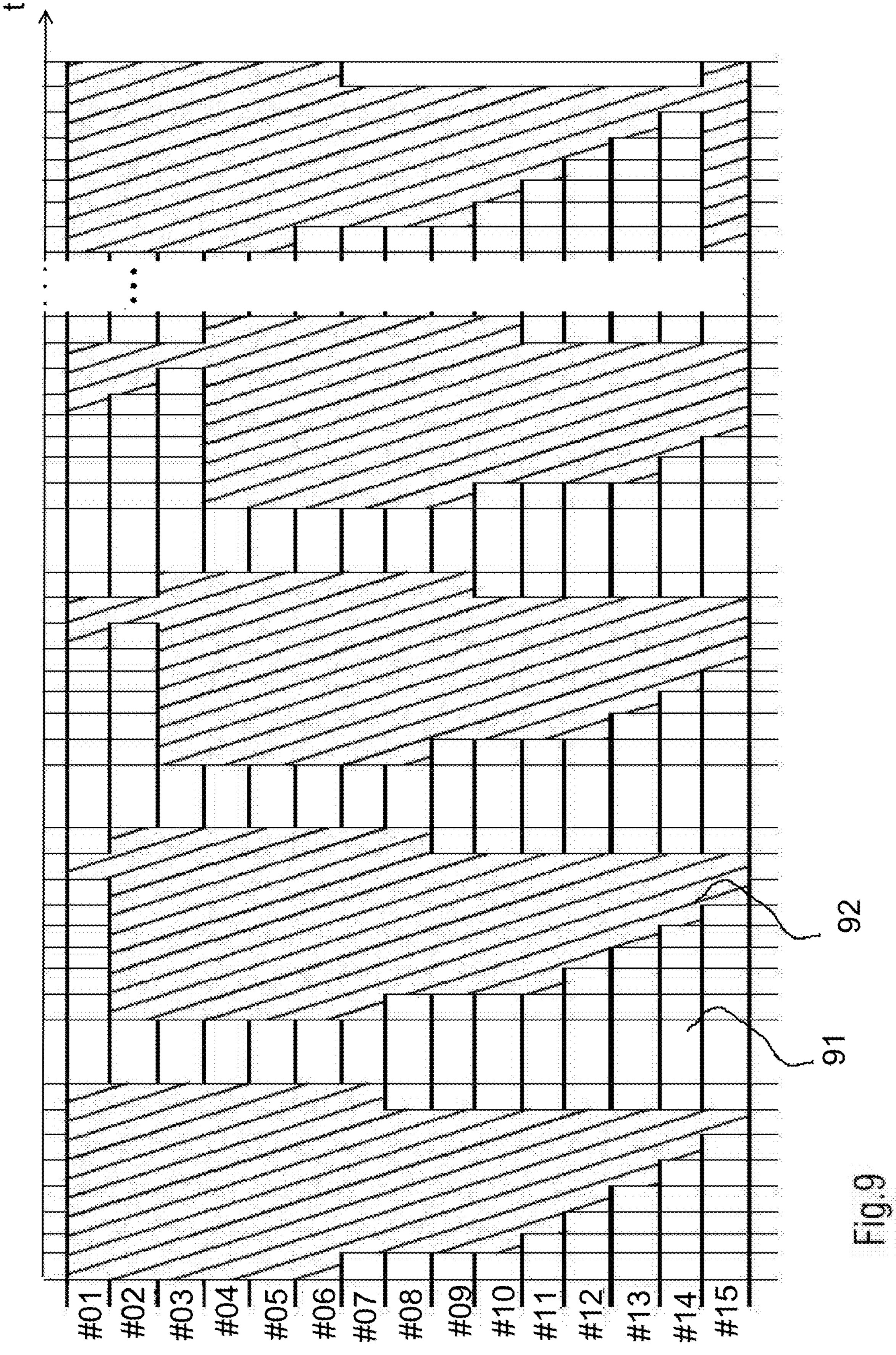
FIG. 9 shows the result of cycling control signal sequences through the LP generators according to some embodiments.

FIG. 9 shows the result of cycling a control signal sequence through an LP generator stack comprising 15 LP generators #01-#015. The diagrams show on the horizontal axis a timeline t like in FIG. 8. On the vertical axis the activation of 15 switching elements, corresponding to 15 LP generators #01 . . . #15 are shown. The diagonal shaded areas 92 are areas where the connecting switching elements are activated. The white box areas 91 are areas where the parallel-to-the-load-switching elements are activated, So, in time frames when no diagonal shaded areas are present, there is no pulse at the output. In the first column the LP generators #01-#06 are switched together with the corresponding connecting switching elements. In the 2$^{nd}$ column the LP generators #01-#10 are switched together with the corresponding connecting switching elements. In the 3$^{rd}$ column the LP generators #01-#11 are switched together with the corresponding connecting switching elements. In the 4$^{th}$ column the LP generators #01-#12 are switched together with the corresponding connecting switching elements, and so on. In this way a pulse is shaped as a step-wise function. In the 9$^{th}$ column the pulse is over, all connecting switching elements are deactivated. Then, in the 10 column the next pulse starts, this time not with the LP generators #01-#06, but with the LP generators #02-#07. While all LP generators in this example have the same output value, the output value at the output of the coupling 20 is the same as it was for the first pulse. The advantage is that each pulse sequence begins on a different LP generator stack so that all 15 LP generators and corresponding switching elements are equally loaded after 15 pulses. This leads to better load distribution among the LP generator stack and thus better power-loss balance between the switching elements.

FIG. 10 shows a plasma processing system with a plasma chamber 100 in which a plasma 101 is established in a plasma space. Such or similar systems are shown and described in US 2020 0118794 A1, U.S. Pat. No. 10,474,184 B2, or U.S. Pat. No. 10,607,813 B2 e.g., In the plasma chamber an upper electrode 103 may be positioned. A gas inlet and/or outlet, in particular a gas supply pipe 104 may be placed from the outside to the inside of the plasma chamber 100, in particular connected to the electrode 103. A substrate 102, in particular a semiconductor wafer may be placed on a support 105 which comprises a substrate holder inside the plasma chamber 100. In use the substrate 102 may be processed by the plasma 101, e.g., in a process of etching, ashing, or deposition in particular with atomic layered deposition. Etching process may be an extremely high challenge, for instance when the ratio between etched hole diameter and hole length is extremely low, <1/100, e.g., as it is in deep etching often necessary. An electric conductive electrode 106 may be placed in the plasma chamber 100, in particular nearby the substrate 102, for example around the substrate 102. This electric conductive electrode 106 may be an edge ring which may be also called focus ring. This electric conductive electrode 106 may be connected to a first power supply 114 via a first connection line 115. The first power supply 114 may be a DC pulsed power supply, where in particular the pulses may be of different length, different amplitude and shaped as described in U.S. Pat. No. 9,287,086 B2 FIG. 11, 14, or U.S. Pat. No. 10,474,184 B2, FIG. 2 e.g., With the control of the first power supply 114 the electric conductive electrode 106 may be used additionally or alternatively as an ion energy and/or ion acceleration direction control as also described in U.S. Pat. No. 9,287,086 B2 or U.S. Pat. No. 10,474,184 B2. A first radio-frequency (RF) power supply 118 may be electrically connected to the support 105 via a first power feeding rod 119 and a first matching unit 116 and a first connection unit 117. A second radio-frequency (RF) power supply 108 may be electrically connected to the upper electrode 103 via a second power feeding rod 109 and a second matching unit 110 and a second connection unit 111. An electrode 107 may be positioned in or nearby the support 105 and is electrically connected to a second power supply 112 via a second connection line 113. The second power supply 112 may be a DC pulsed power supply, where in particular the pulses may be of different length, different amplitude and shaped as described in U.S. Pat. No. 9,287,086 B2 FIG. 11, 14, or U.S. Pat. No. 10,474,184 B2, FIG. 2 e.g., The substrate 102 may be fixed at the support 105 via the electrode 107 which may work as an electrostatic chuck. With the control of the second power supply 112 the electrode 107 may be used additionally or alternatively as an ion energy and/or ion acceleration direction control as described in U.S. Pat. No. 9,287,086 B2 or U.S. Pat. No. 10,474,184 B2.

Some plasma treatment applications, such as etching or layer deposition, demand a high voltage (HV), high frequency (HF), rectangular, asymmetrical, pulsed voltage supply. Often the voltage values significantly exceed the voltage handling possibilities of individual semiconductor switches, especially when high frequency operation is required.

Some plasma applications require not only pulsing, but pulse-to-pulse amplitude variation. Some plasma applications require the source to deliver high peak currents in order to obtain short voltage transition times. Most plasma applications present a load, which contains a capacitive component. Significant power loss is related to the pulse-by-pulse charging and discharging process of this load capacitance. Some plasma applications require pulse shaping as described in U.S. Pat. No. 9,287,086 B2 FIG. 11, 14, or U.S. Pat. No. 10,474,184 B2, FIG. 2, e.g., Therefore, a series connection of such switches is one possible solution. Series connection requires voltage balancing means. These voltage balancing means are not easily realizable in HF operation.

Figure 11:
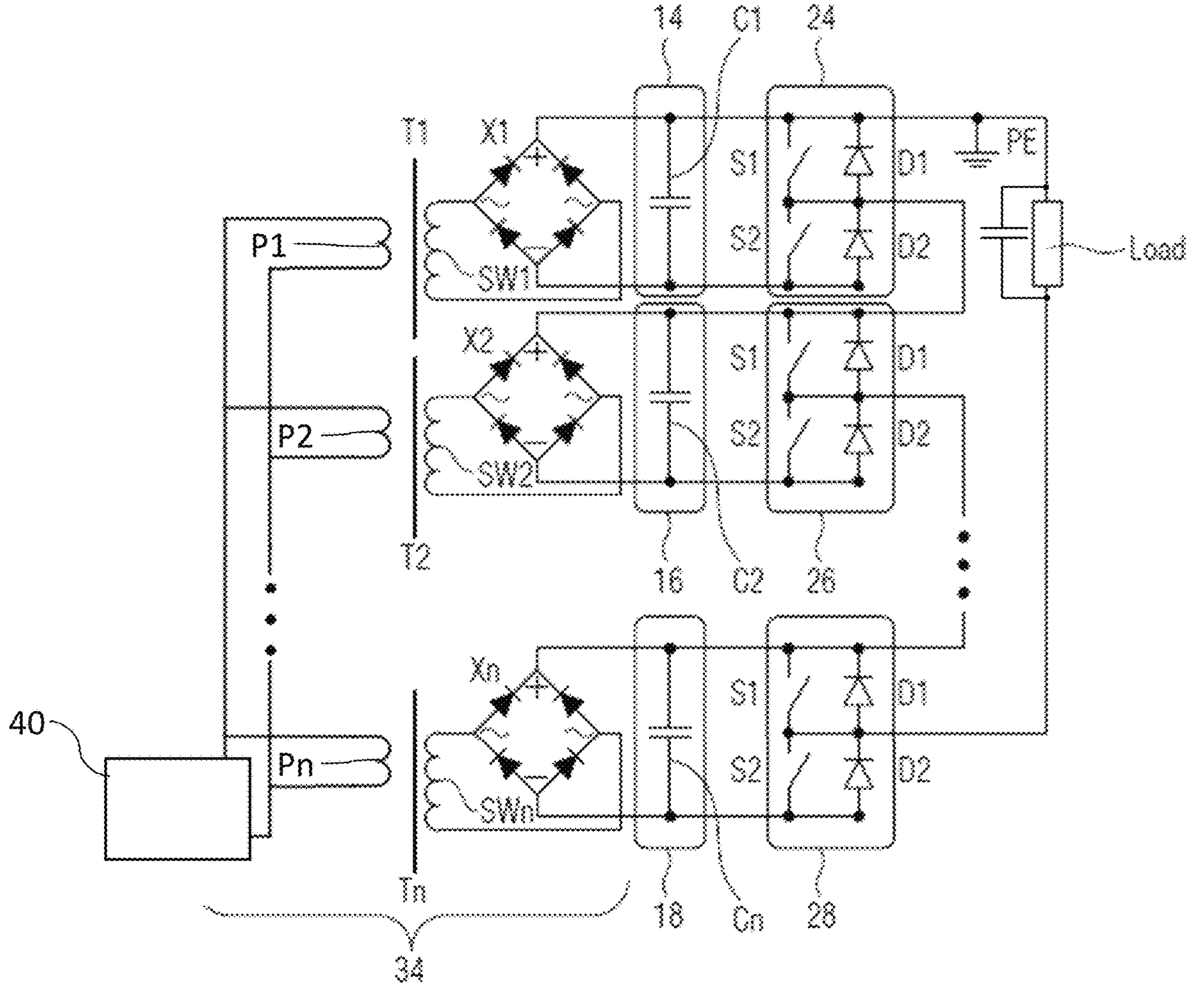
FIG. 11 shows an alternative embodiment of an HP generator.

FIG. 11 shows an alternative embodiment of an HP generator as shown in FIG. 5. The difference between the HP generator as shown in FIG. 5 and FIG. 11 is that in FIG. 11 the primary winding P1, P2, . . . Pn is connected in parallel to the transformers T1, T2, . . . Tn, and that no balancing windings BW are provided.

Figure 12:
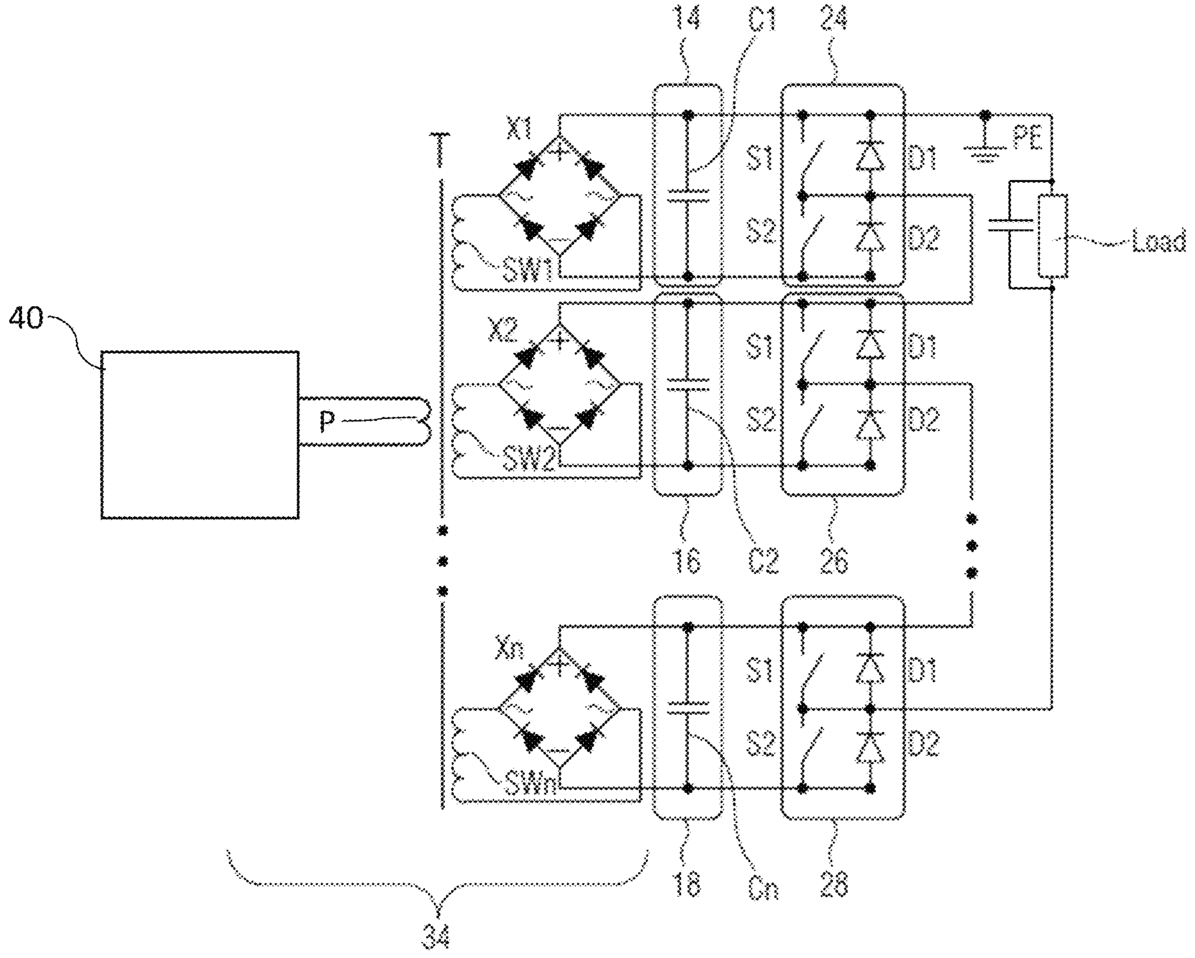
FIG. 12 shows an alternative embodiment of an HP generator.

FIG. 12 shows a further alternative embodiment of an HP generator as shown in FIG. 5. The difference between the HP generator as shown in FIG. 5 and FIG. 12 is that in FIG. 12 all transformers T1, T2, . . . Tn of FIG. 5 are in FIG. 12 incorporated as one main transformer T1 with only one core. Only one primary winding P is needed, and no balancing windings BW are provided.

Figure 13:
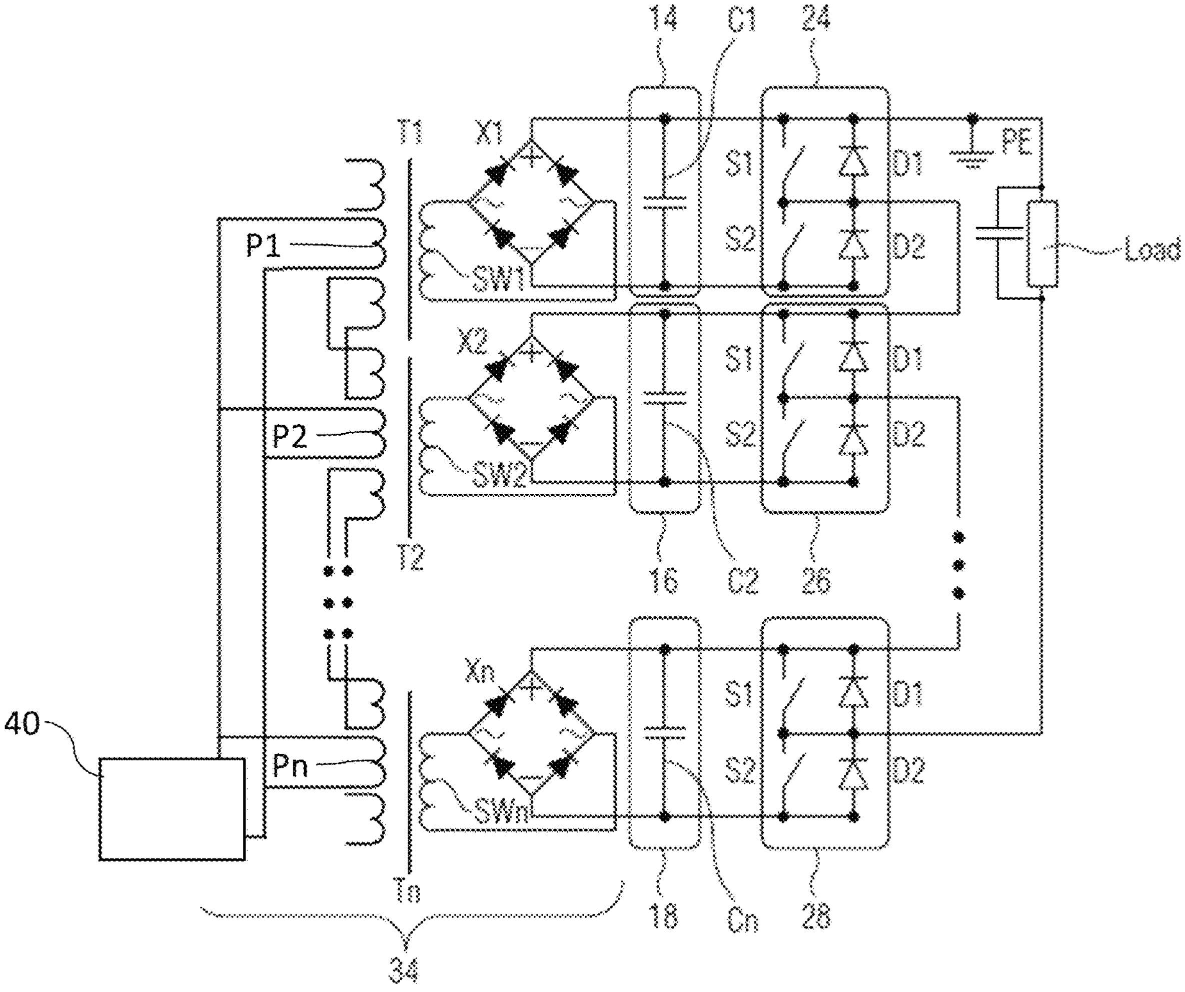
FIG. 13 shows an alternative embodiment of an HP generator.

FIG. 13 shows a further alternative embodiment of an HP generator as shown in FIG. 5. The difference between the HP generator as shown in FIG. 5 and FIG. 13 is that in FIG. 13 the primary winding P1, P2, . . . Pn is connected in parallel to the transformers T1, T2, . . . Tn. Balancing windings are shown, also not absolutely necessary in such a configuration.

Figure 14:
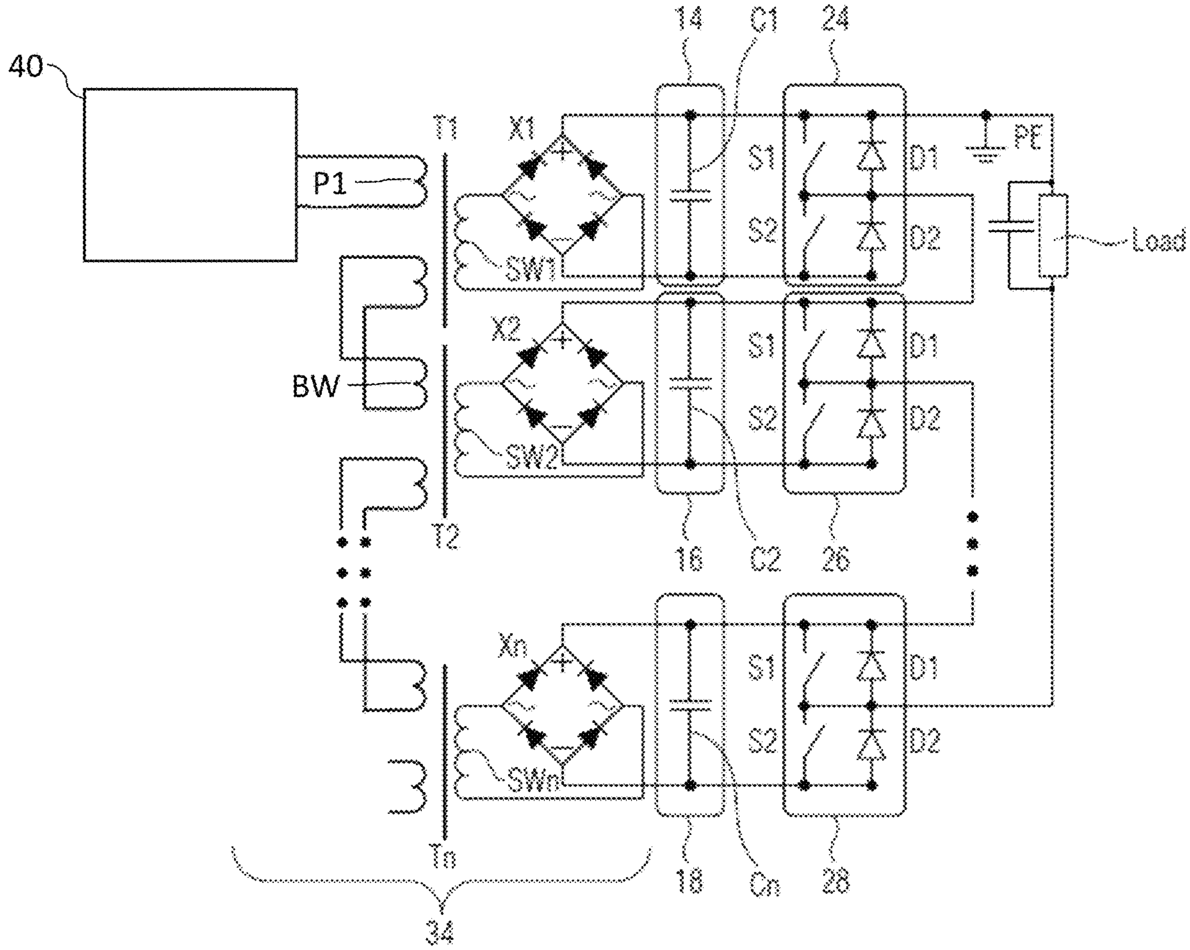
FIG. 14 shows an alternative embodiment of an HP generator.

FIG. 14 shows an alternative embodiment of an HP generator as shown in FIG. 5. The difference between the HP generator as shown in FIG. 5 and FIG. 14 is that in FIG. 14 the primary winding P1 is connected only to the transformers T1. Balancing windings BW are used to transport the energy from transformer T1 to T2 and from transformer T2 to the following transformers.

Figure 15:
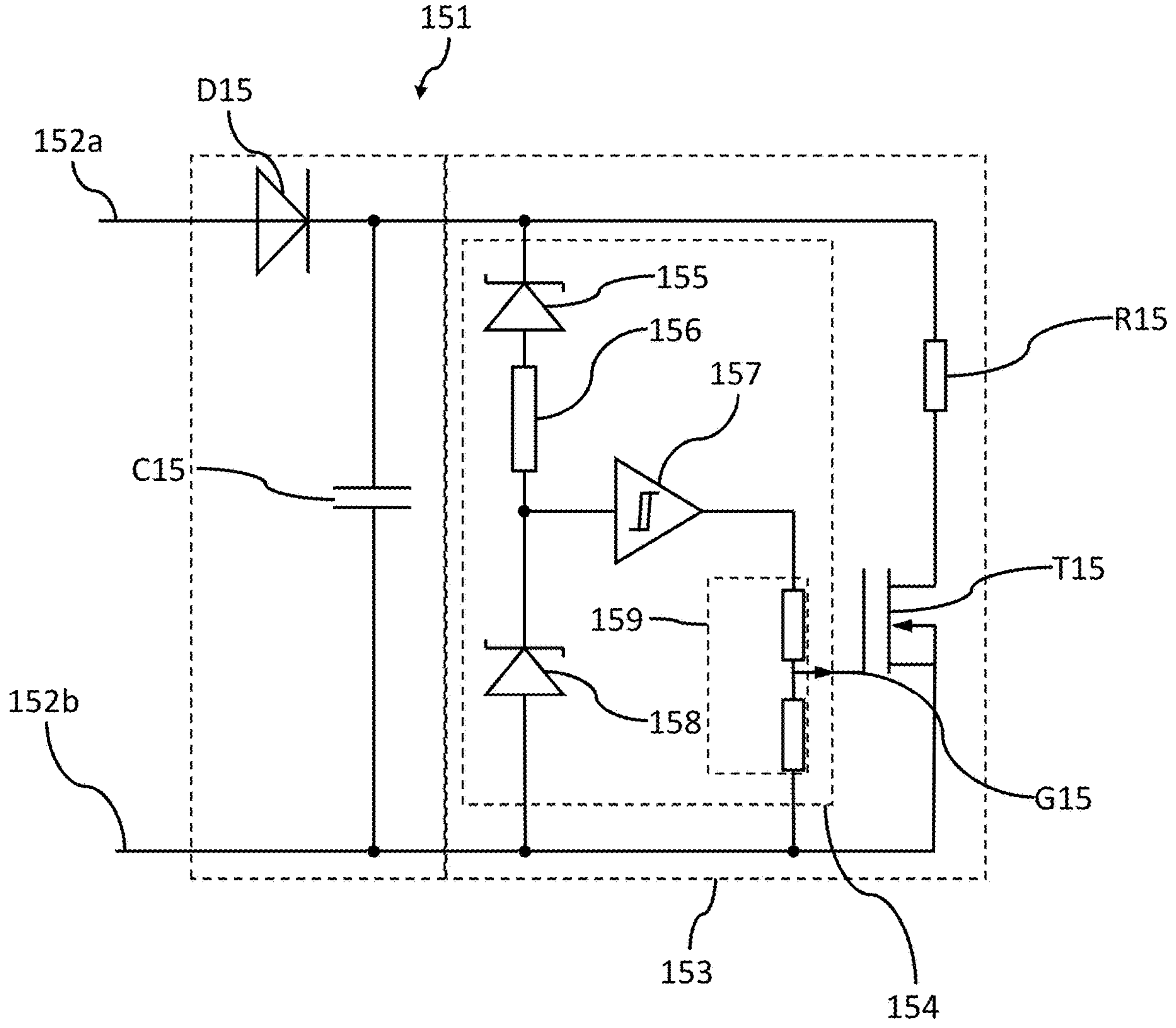
FIG. 15 shows an example of an LP-generator-value limiting circuit according to some embodiments.

FIG. 15 shows an example of an LP-generator-value limiting circuit 151. This LP-generator-value limiting circuit 151 is a voltage limiting circuit. It may be connected with its ends 152*a*, 152*b* in parallel to one, or some, or all of the LP generators 14, 16, 18. It could also be connected with its ends 152*a*, 152*b* in parallel to one, or some, or all of the switching units 24, 26, 28. This LP-generator-value limiting circuit 151 comprises a series circuit of a diode D15 and capacitor C15 to clamp the overvoltage present at its ends 152, 153 to a voltage the capacitor C15 is charged up. The voltage of the capacitor C15 will be controlled by a discharge circuit 153. The discharge circuit 153 comprises a transistor T15, in this case a MOSFET, and a resistor R15 in this case a power resistor, configured to be cooled very effectively. The transistor T15 is controlled in a way to be switched on or off, so in a pulsing mode. So, the transistor T15 does not dissipate to much energy into heat and is kept quite cool. When the transistor T15 is switched on, the capacitor will be discharged and the discharge current flows through resistor R15, dissipating the energy into heat. Most of the heat is generated in the resistor R15, which is easier and cheaper to keep cool enough as the transistor T15. The transistor T15 is controlled over its control input G15 by a voltage control circuit 154. The voltage control circuit 154 comprises a series connection of a first high-voltage Zener-diode 155, a current limiting resistor 156, a second low-voltage Zener-diode 158. The connection point of the current limiting resistor 156 with a second low-voltage Zener-diode 158 is connected to the control input G15 of the transistor T15. The voltage control circuit 154 may further comprise a driver 157. The driver 157 may be connected with its input to the connection point of the current limiting resistor 156, a second low-voltage Zener-diode 158. The driver 157 may be connected with its output to the control input G15 of the transistor T15. Between the output of the driver 157 and the control input G15 of the transistor T15 may be connected a voltage divider 159.

The driver may have a hysteresis at its input, so embodied as a Schmitt-Trigger. So, it generates a pulsing signal to drive the discharge transistor T15 with a frequency of about 2 to 20 kHz. With such a configuration, over 90% of the power is dissipated in the resistor R15. This keeps the transistor cool enough to work reliable for a long time.

Figure 16:
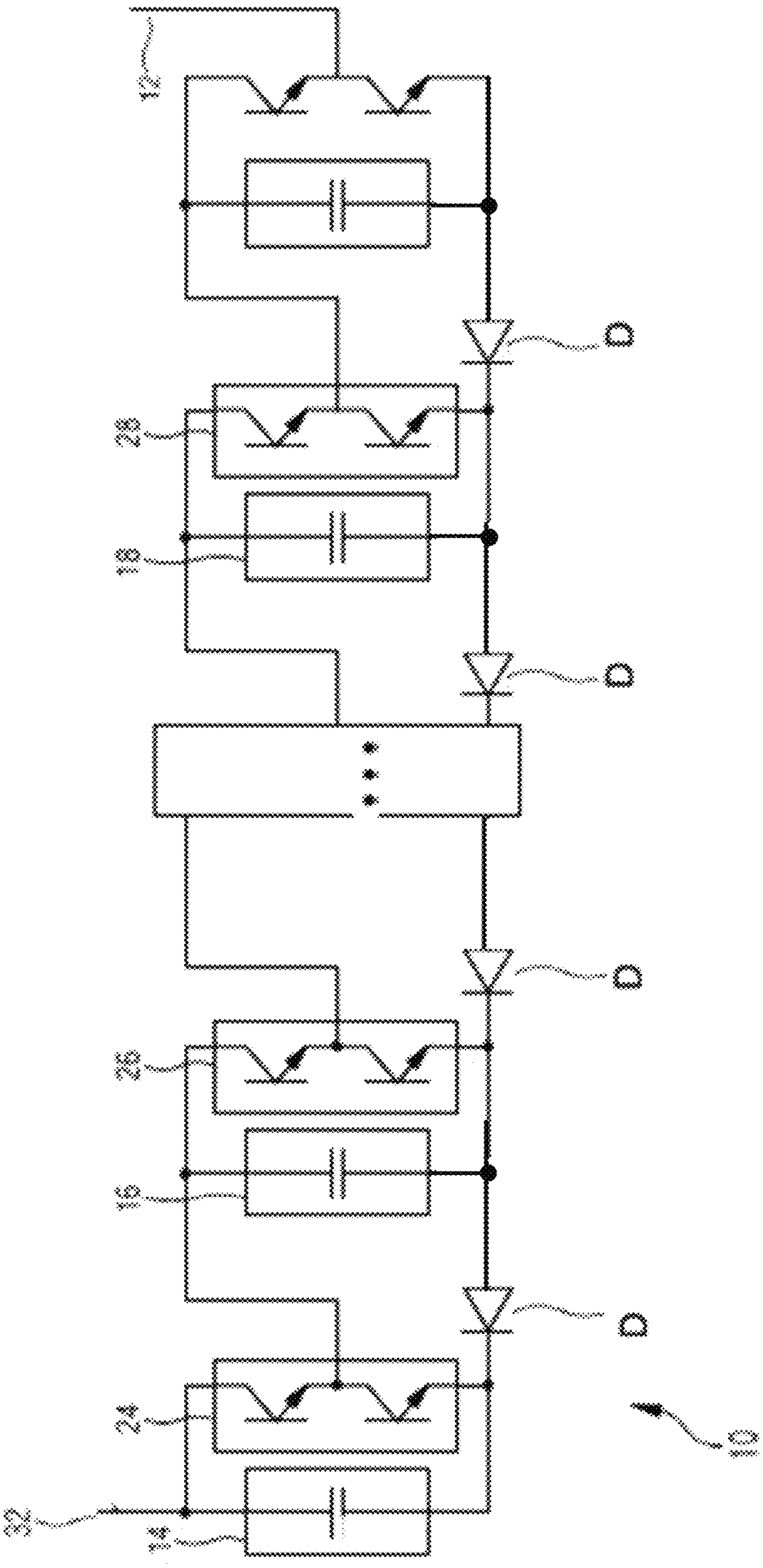
FIG. 16 shows an embodiment of an HP generator with balancing circuits.

FIG. 16 shows an embodiment of an HP generator 10 with balancing circuits comprising a component allowing current flow in one direction only, in particular a diode D or component working like a diode, is connected between two LP generators 14, 16 and 18. A balancing circuit, in particular a diode D, is connected between two negative outputs of the LP generators 14, 16, 18. This enables the energy from a lower stage energy storage component to be transferred to the energy storage component of a higher stage when the switching element S1 is activated and if the lower stage energy storage component voltage exceeds that on the higher stage. The charge of the highest stages 14 will accumulate the excessive charge from the entire stack. The highest stages 14 should therefore be controlled to provide the most power to the load in order to get rid of the excessive charge. Using diodes D or circuits containing a diode leads to better voltage distribution along the LP generator stack.

Figure 17:
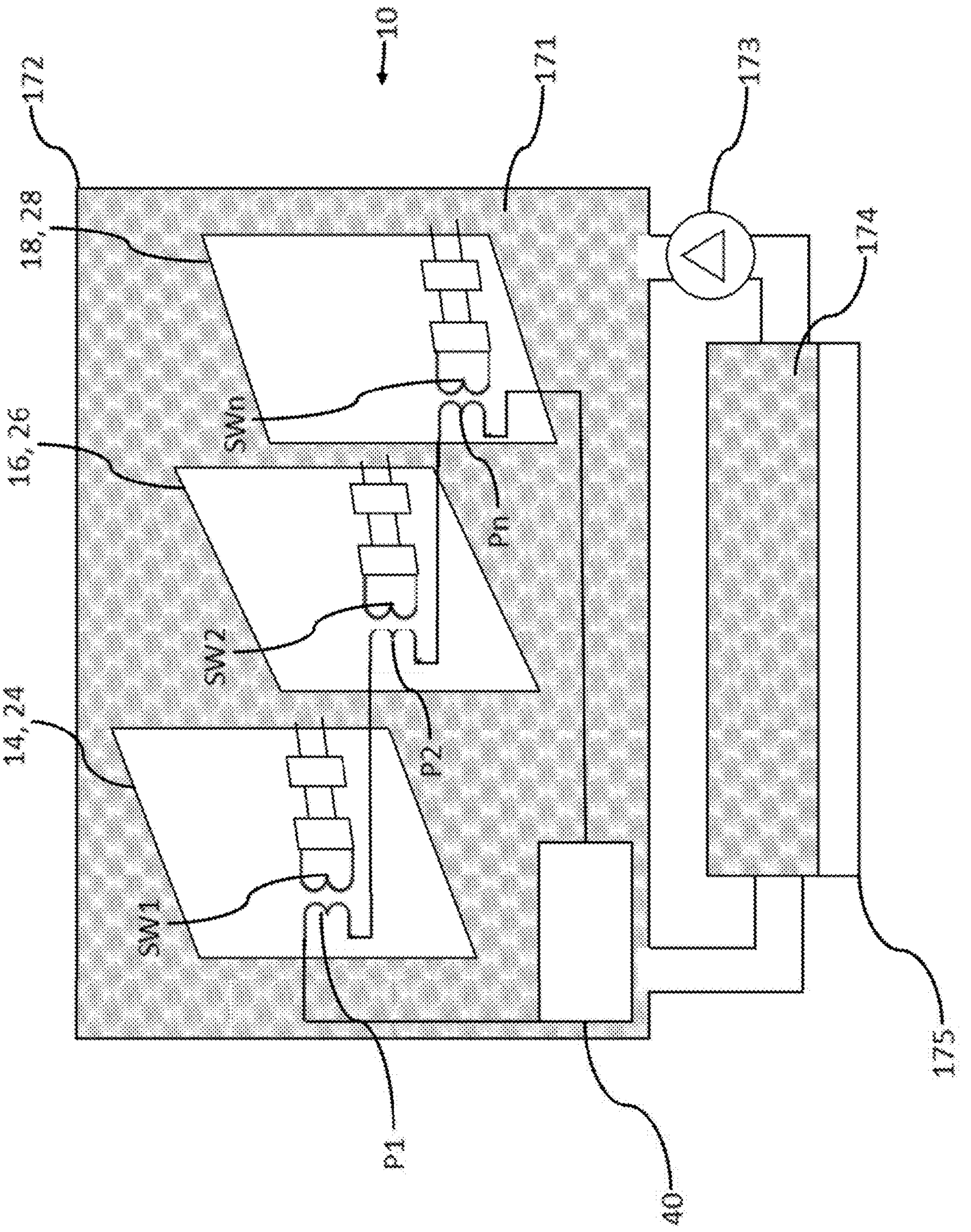
FIG. 17 shows an embodiment of an HP generator with liquid cooling.

FIG. 17 shows an embodiment of an HP generator 10 with a liquid cooling. All electronic parts of the HP generator 10, as for example the LP generators 14, 16, 18, the switching units 24, 26, 28, transformer T1, T2, Tn, and the inverter 40 are located in a liquid-proof housing 171. Nearby the housing is located a liquid reservoir 174. Between the housing and the reservoir 174 is located a liquid pump 173 for circulating the liquid 171 between the housing and the reservoir 174 in a closed liquid loop. The reservoir is in thermal contact to a heat exchanger 175 to transfer the heat from the closed cooling liquid loop to the environment.

Figure 18A:
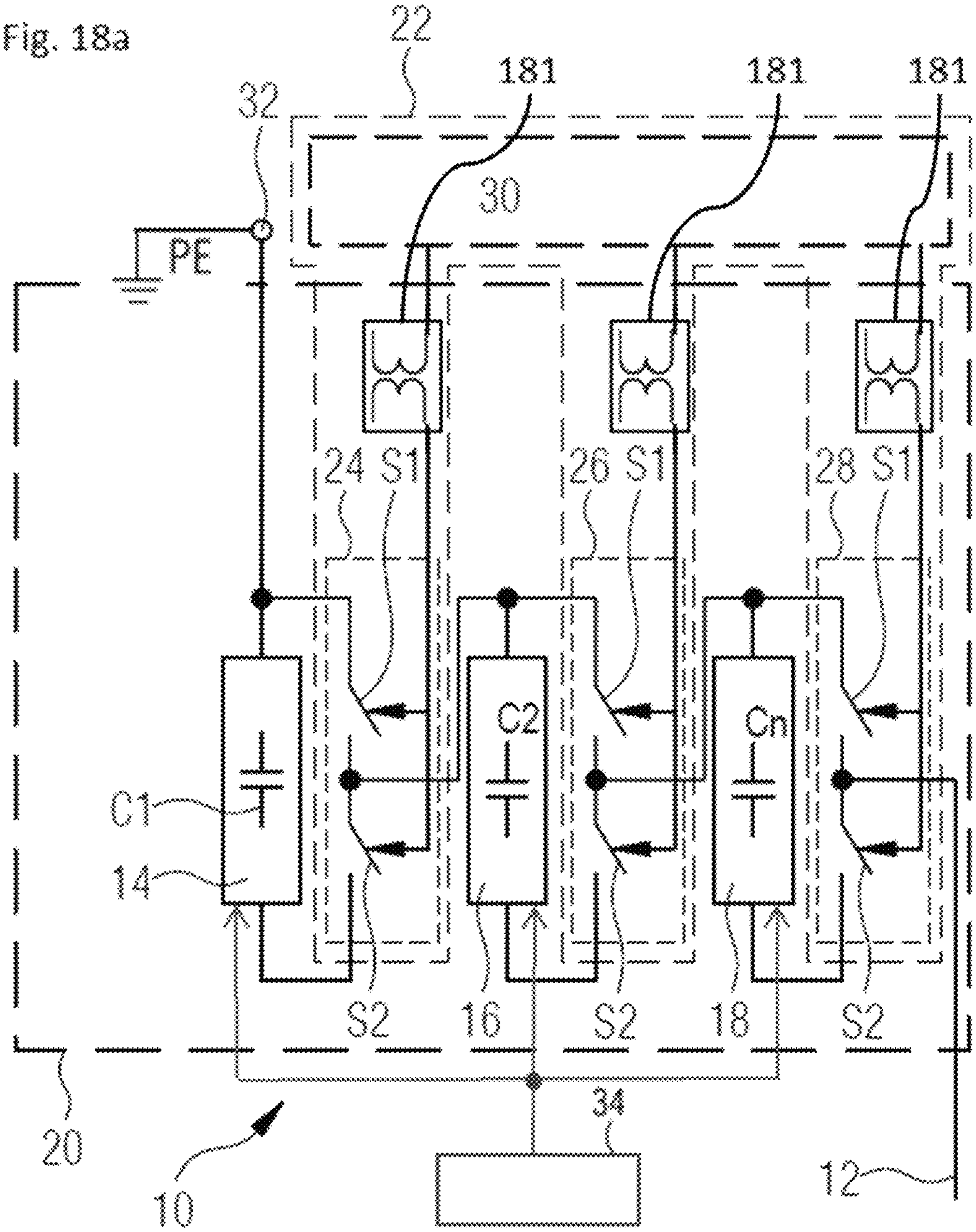
FIG. 18*a* shows an embodiment of an HP generator with galvanically.
Figure 18B:
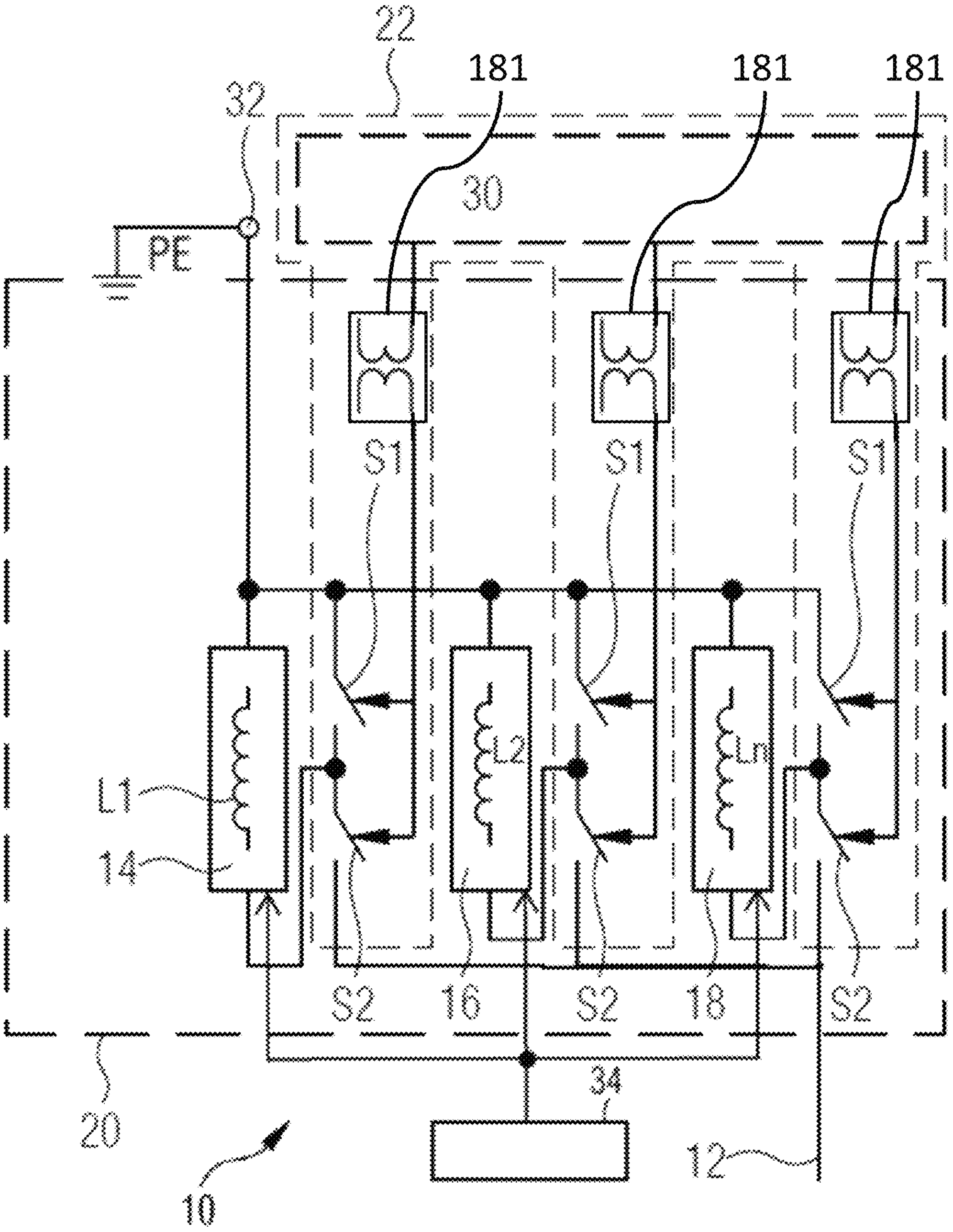
FIG. 18*b* shows isolated drivers according to some embodiments.

FIGS. 18*a* and 18*b* show an embodiment of an HP generator 10 with galvanically isolated connections 181 between driver 30 and switching elements S1, S2.

So, here the control unit 22 is configured to select the contribution of LP generators 14, 16, 18 in a galvanically isolated way, in particular via a fiber optic connection or magnetically coupling. The connection between output of a data processor and the switching units 24, 26, 28 may be realized by fiber optics or by magnetically coupling. This could help to switch all LP generators 14, 16, 18 effectively and fast and without time delay to form a pulse with sharp edges in voltage, e.g. several switching elements S1, S2 of one switching unit 24, 26, 28 could be connected by one galvanically isolated connection. Several LP generators 14, 16, 18 with corresponding switching units 24, 26, 28 could be merged to one group, which could be configured in a way that this group is activated or deactivated only together. Then, for such a group it is possible to use only one galvanically isolated connection 181. Galvanic isolation (transmitter and receiver) may be used for every switch. Groups of transmitters may be controlled simultaneously decreasing the number of control signals required. Reducing the number of galvanically isolated connections 181 could save costs and makes the HP generator 10 more reliable due to less parts with failure risk.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A high power (HP) generator configured to deliver a pulsed high power with a high voltage and/or a high current to a capacitive load, the HP generator comprising:

a plurality of low power (LP) generators, each respective LP generator comprising a respective energy storage component, wherein, during operation, the respective energy storage component is charged to a respective predefined value related to the respective energy storage component, the predefined value being a voltage of a capacitor or a current of an inductor, each respective LP generator configured to supply, during operation, at an output thereof a respective LP-generator-output, which corresponds to the respective predefined value of the respective energy storage component incorporated in the respective LP generator, a coupling in which the plurality of LP generators is electrically connected such that a coupling-value at an output of the coupling, which corresponds to an output of the HP generator, is obtainable, wherein the coupling-value is a voltage, a current, or a power, and wherein, during operation, the coupling-value is higher than the LP-generator-output at the output of one of the plurality of LP generators, and a control unit configured to select a respective contribution of each of the plurality of LP generators to the output of the HP generator during power delivery of the HP generator, in order to generate a rise and/or a decay of a pulse at the output of the coupling, such that each of the plurality of LP generators contributes to the pulse simultaneously during at least a portion of a duration of the pulse, wherein the control unit is further configured to select the respective contribution of each of the plurality of LP generators in a galvanically isolated way, via a fiber optic connection or a magnetic coupling, and such that the plurality of LP generators are activated sequentially during the pulse.

2. The HP generator according to claim 1, wherein the control unit is further configured to select the respective contribution of each of the plurality of LP generators in a way that one or a combination of following features is accomplished:

the output of the coupling and/or the output of the HP generator is a step-function, at a rising edge and/or a falling edge of a pulse, and/or during the pulse, at least one amplitude step is lower than 1 kV, the plurality of LP generators is connected by switching only.

3. The HP generator according to claim 1, wherein more than four LP generators of the plurality of LP generators are electrically connected in the coupling, and/or wherein a number of LP generators electrically connected in the coupling is high enough to form, at the output of the coupling:

pulses with a voltage rise and/or a voltage fall equal to or higher than a sum of the LP-generator-outputs of the number of LP generators, and a step-line pulse shape, wherein a step of the step-line pulse shape is equal to or higher than the LP-generator-outputs of one or more of the number of LP generators.

4. The HP generator according to claim 1, wherein a charging energy of the plurality of LP generators is supplied over a transformer, with a primary winding and a secondary winding for each respective LP generator, a. wherein the secondary winding is connected to a rectifier, the rectifier is connected to the energy storage component of the corresponding LP generator, and/or b. wherein a plurality of the primary windings is connected in series.

5. The HP generator according to claim 1, wherein a charging energy of the plurality of LP generators is supplied over a plurality of transformers, wherein each respective transformer corresponds to a respective LP generator and comprises at least one balancing winding, and wherein a balancing winding of one transformer is connected to a balancing winding of a different transformer.

6. The HP generator according to claim 1, further comprising a balancing circuit, the balancing circuit comprising a component allowing a current to flow in one direction only.

7. The HP generator according to claim 1, further comprising a damping circuit positioned between each pair of adjacent LP generators of the plurality of LP generators in an open chain configuration, wherein the damping circuit comprises a resistor and/or an inductor.

8. The HP generator according to claim 1, wherein the HP generator is at least partially directly liquid cooled, by being immersed in a dielectric cooling liquid.

9. The HP generator according to claim 1, wherein the control unit is configured to select the respective contribution of each of the plurality of LP generators in a sequenced way through the plurality of LP generators, wherein each pulse sequence begins on a different LP generator.

10. The HP generator according to claim 1, wherein the control unit comprises switching units, having a current rise capability of at least 10 A/μs, and/or having a capability of withstanding voltage of at least 0.5 kV with voltage rise and fall rates of at least 15 kV/μs.

11. The HP generator according to claim 1, wherein the control unit is configured to select the respectfully contribution of each of the plurality of LP generators in a way to reduce voltage overshoots at the output of the HP generator and/or at a dedicated location on the capacitive load.

12. The HP generator according to claim 1, wherein at least one LP generator comprises an LP-generator-output limiting circuit.

13. The HP generator according to claim 1, wherein a charging energy of the plurality of LP generators is supplied over a transformer with a primary winding and a secondary winding for each respective LP generator, the HP generator further comprising an inverter connected to the primary windings, the inverter comprising a full-bridge circuit and a buck converter.

14. A method of supplying a plasma process with high power pulses having varying amplitudes provided by a high power (HP) generator, the HP generator comprising a plurality of low power (LP) generators electrically connected in a coupling, each respective LP generator comprising a respective energy storage component, the method comprising:

c. continuously charging the respective energy storage component of each respective LP generator of the plurality of LP generators to a respective predefined value, the predefined value being a voltage of a capacitor or a current of an inductor, and d. selectively coupling outputs of at least some of the plurality of LP generators sequentially to obtain a desired output of the HP generator corresponding to a pulse having a desired amplitude, by controlling the plurality of LP generators, e. selecting the respective contribution of each of the plurality of LP generators in a galvanically isolated way, via a fiber optic connection or a magnetically coupling, such that each of the plurality of LP generators contributes to the pulse simultaneously during at least a portion of a duration of the pulse.

15. The HP generator according to claim 14, wherein selectively coupling outputs of at least some of the plurality of LP generators sequentially to obtain the desired output of the HP generator includes activating the LP generators such that consecutive pulses of the HP generator begin on different LP generators.

* * * * *